United States Patent
Travers et al.

(10) Patent No.: US 12,237,639 B2
(45) Date of Patent: Feb. 25, 2025

(54) HOLLOW-CORE PHOTONIC CRYSTAL FIBER BASED BROADBAND RADIATION GENERATOR

(71) Applicant: ASML NETHERLANDS B.V., Veldhoven (NL)

(72) Inventors: John Colin Travers, Edinburgh (GB); Federico Belli, Edinburgh (GB); Malte Christian Brahms, Edinburgh (GB); Andreas Johannes Antonius Brouns, Eindhoven (NL); Ronald Franciscus Herman Hugers, Best (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/085,338

(22) Filed: Dec. 20, 2022

(65) Prior Publication Data
US 2023/0144419 A1    May 11, 2023

Related U.S. Application Data

(63) Continuation of application No. 17/460,430, filed on Aug. 30, 2021, now Pat. No. 11,563,298.

(30) Foreign Application Priority Data

| Sep. 3, 2020 | (EP) | ..................... 20194353 |
| Oct. 20, 2020 | (EP) | ..................... 20202720 |
| Apr. 19, 2021 | (EP) | ..................... 21169105 |

(51) Int. Cl.
*G02B 6/02* (2006.01)
*G02F 1/35* (2006.01)
(Continued)

(52) U.S. Cl.
CPC ...... *H01S 3/06741* (2013.01); *G02B 6/02328* (2013.01); *G02F 1/3528* (2021.01); *G03F 7/70625* (2013.01)

(58) Field of Classification Search
CPC .. G02B 6/3859; G02B 6/3676; G02B 6/3858; G02B 6/3664–3672; G02B 6/3616;
(Continued)

(56) References Cited

U.S. PATENT DOCUMENTS

| 3,624,816 A | * | 11/1971 | Strack | ..................... G02B 6/06 |
| | | | | 385/115 |
| 4,132,461 A | * | 1/1979 | Jacques | ............... G02B 6/3842 |
| | | | | 385/64 |

(Continued)

FOREIGN PATENT DOCUMENTS

| EP | 1628164 | 2/2006 |
| EP | 3719551 | 10/2020 |

(Continued)

OTHER PUBLICATIONS

European Search Report issued in corresponding European Patent Application No. 20202720, dated Mar. 5, 2021.

(Continued)

*Primary Examiner* — Rhonda S Peace
(74) *Attorney, Agent, or Firm* — Pillsbury Winthrop Shaw Pittman, LLP

(57) ABSTRACT

A broadband radiation source device, including a fiber assembly having a plurality of optical fibers, each optical fiber being filled with a gas medium, wherein the broadband radiation source device is operable such that subsets of the optical fibers are independently selectable for receiving a beam of input radiation so as to generate a broadband output from only a subset of the plurality of optical fibers at any one time.

20 Claims, 12 Drawing Sheets

(51) Int. Cl.
*G03F 7/00* (2006.01)
*H01S 3/067* (2006.01)
(58) Field of Classification Search
CPC .......... G02B 6/3628–364; G02B 6/3648–368; G02B 6/04–08; H01S 3/06741; G02F 1/3528; G03F 7/70625
See application file for complete search history.

(56) References Cited

U.S. PATENT DOCUMENTS

| | | | |
|---|---|---|---|
| 4,460,820 A * | 7/1984 | Matsumoto | B29C 61/00 219/535 |
| 4,735,479 A * | 4/1988 | Nicholls | G02B 6/3672 385/83 |
| 4,784,464 A * | 11/1988 | Ouchi | A61B 1/00165 385/115 |
| 4,810,053 A * | 3/1989 | Woith | G02B 6/3858 385/83 |
| 5,073,048 A * | 12/1991 | Adachi | G02B 6/06 385/115 |
| 5,321,785 A * | 6/1994 | Iida | G02B 6/3839 385/115 |
| 5,533,160 A * | 7/1996 | Watanabe | G02B 6/2551 219/121.45 |
| 6,138,476 A * | 10/2000 | Watanabe | G02B 6/2555 65/102 |
| 6,243,520 B1 * | 6/2001 | Goldman | G02B 6/06 385/115 |
| 6,328,481 B1 * | 12/2001 | Nakaya | G02B 6/3842 385/115 |
| 6,367,990 B1 * | 4/2002 | Dumitriu | G02B 6/2558 385/95 |
| 6,632,023 B1 * | 10/2003 | Ogawa | G02B 6/3825 439/453 |
| 6,786,649 B2 * | 9/2004 | Sherrer | G02B 6/3838 385/83 |
| 6,952,253 B2 | 10/2005 | Lof et al. | |
| 6,961,116 B2 | 11/2005 | Den Boef et al. | |
| 7,196,839 B1 | 3/2007 | Sanders et al. | |
| 7,212,720 B2 * | 5/2007 | Wied | G02B 6/04 385/115 |
| 7,265,364 B2 | 9/2007 | Teunissen et al. | |
| 7,463,806 B2 | 12/2008 | Borrelli | |
| 7,492,998 B2 * | 2/2009 | Miller | G02B 6/04 385/115 |
| 7,646,471 B2 | 1/2010 | Teunissen et al. | |
| 9,160,137 B1 | 10/2015 | Abdolvand et al. | |
| 9,570,876 B2 | 2/2017 | Clowes et al. | |
| 9,664,851 B2 * | 5/2017 | Takeuchi | G02B 6/423 |
| 10,243,319 B1 | 3/2019 | Keyser | |
| 10,527,908 B2 | 1/2020 | Kambhampati | |
| 10,901,158 B1 * | 1/2021 | Chia | G02B 6/3881 |
| 11,563,298 B2 * | 1/2023 | Travers | G03F 7/70616 |
| 11,940,649 B2 * | 3/2024 | Kawasaki | G02B 6/3664 |
| 2002/0064350 A1 * | 5/2002 | Pawluczyk | G02B 6/403 385/54 |
| 2003/0021576 A1 * | 1/2003 | Irie | G02B 6/02033 385/143 |
| 2003/0165317 A1 * | 9/2003 | Petruziello | G02B 6/3636 385/137 |
| 2004/0091210 A1 * | 5/2004 | Tanaka | G02B 6/2938 385/95 |
| 2004/0175085 A1 | 9/2004 | Forbes et al. | |
| 2007/0296960 A1 | 12/2007 | Den Boef et al. | |
| 2008/0198380 A1 | 8/2008 | Straaijer et al. | |
| 2009/0168062 A1 | 7/2009 | Straaijer | |
| 2010/0007863 A1 | 1/2010 | Jordanoska | |
| 2010/0233600 A1 | 9/2010 | Den Boef et al. | |
| 2010/0328655 A1 | 12/2010 | Den Boef | |
| 2011/0026032 A1 | 2/2011 | Den Boef et al. | |
| 2011/0032500 A1 | 2/2011 | Straaijer | |
| 2011/0102753 A1 | 5/2011 | Van De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0308142 A1 | 11/2013 | Straaijer | |
| 2014/0010501 A1 * | 1/2014 | Saito | G02B 6/2551 156/182 |
| 2014/0153880 A1 * | 6/2014 | Rindge | G02B 6/4298 385/80 |
| 2015/0261097 A1 | 9/2015 | Mathijssen et al. | |
| 2016/0161863 A1 | 6/2016 | Den Boef et al. | |
| 2016/0370717 A1 | 12/2016 | Den Boef et al. | |
| 2019/0164669 A1 | 5/2019 | Glew | |
| 2019/0302570 A1 | 10/2019 | Kumar et al. | |
| 2020/0103603 A1 * | 4/2020 | Halderman | G02B 6/403 |
| 2022/0069537 A1 | 3/2022 | Travers | |
| 2022/0201192 A1 | 6/2022 | Wada et al. | |
| 2023/0144419 A1 | 5/2023 | Travers | G03F 7/70625 385/125 |

FOREIGN PATENT DOCUMENTS

| | | |
|---|---|---|
| TW | I600931 | 10/2017 |
| WO | 2011012624 | 2/2011 |
| WO | 2016102127 | 6/2016 |
| WO | 2017032454 | 3/2017 |
| WO | 2017211694 | 12/2017 |
| WO | 2018127266 | 7/2018 |
| WO | 2020083624 | 4/2020 |

OTHER PUBLICATIONS

"Multi-fiber supercontinuum source to reduce source noise and optimize spectrum", Research Disclosure 672044 (Apr. 2020).
European Search Report issued in corresponding European Patent Application No. 21189551, dated Jan. 11, 2022.
Office Action dated Sep. 26, 2022, issued in corresponding Taiwanese Office Action No. 110131390, pp. 1-9.

* cited by examiner

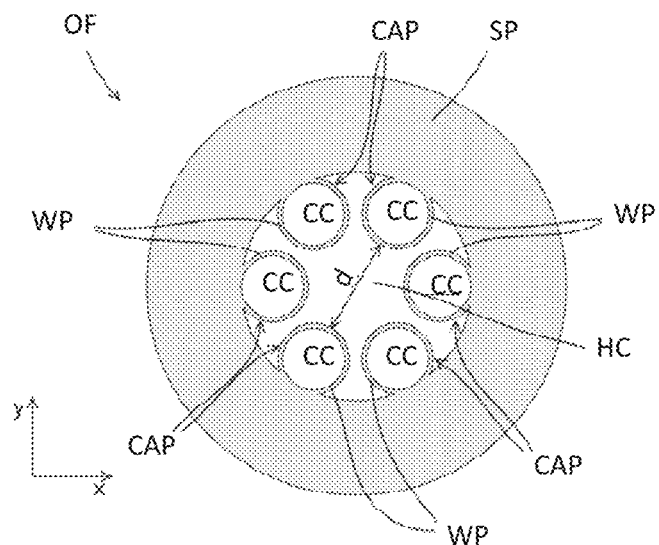
Fig. 7
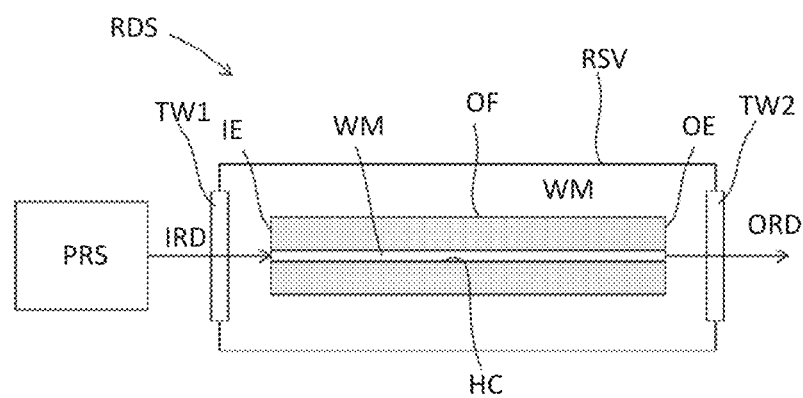
Fig. 8
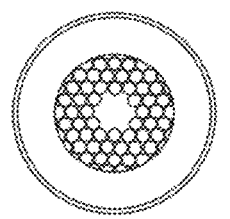 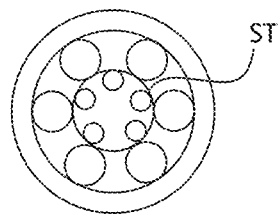
Fig. 9(a)     Fig. 9(b)

HOLLOW-CORE PHOTONIC CRYSTAL FIBER BASED BROADBAND RADIATION GENERATOR

This application is a continuation of U.S. patent application Ser. No. 17/460,430, filed Aug. 30, 2021, which claims the benefit of priority of European patent application no. 21169105.0, filed Apr. 19, 2021, of European patent application no. 20202720.7, filed Oct. 20, 2020, and of European patent application no. 20194353.7, filed Sep. 3, 2020, each of the foregoing applications is incorporated herein in its entirety by reference.

FIELD

The present disclosure relates to a hollow-core photonic crystal fiber based broadband radiation generator, and in particular such a broadband radiation generator in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits. A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

Metrology tools are used in many aspects of a device manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation source is required. For various reasons, including measurement robustness and accuracy, broadband or white light radiation sources are increasingly used for such metrology applications. It would be desirable to improve on present devices for broadband radiation generation.

SUMMARY

In an aspect, there is provided a broadband radiation source device, comprising a fiber assembly comprising a plurality of optical fibers, each optical fiber being filled with a gas medium, wherein the broadband radiation source device is operable such that subsets of the optical fibers are independently selectable for receiving a beam of input radiation so as to generate a broadband output from only a subset of the plurality of optical fibers at any one time. For example, proper subsets of the optical fibers are independently selectable so as to generate a broadband output from only a subset of the plurality of optical fibers.

In an aspect, there is provided a method for generating broadband radiation, the method comprising: emitting input radiation from a pump source; receiving the input radiation by a selected subset of a plurality of optical fibers; and generating from the selected subset of the plurality of optical fibers a broadband output.

Other aspects of the invention comprise metrology device comprising a broadband radiation source device as described herein.

BRIEF DESCRIPTION OF THE DRAWINGS

Embodiments of the invention will now be described, by way of example only, with reference to the accompanying schematic drawings, in which:

FIG. 7 is a schematic cross sectional view of a hollow core optical fiber in a transverse plane (i.e. perpendicular to an axis of the optical fiber), wherein the fiber may form part of a radiation source according to an embodiment;

FIG. 8 depicts a schematic representation of a radiation source according to an embodiment for providing broadband output radiation;

FIGS. 9(a) and 9(b) schematically depict transverse cross-sections of examples of hollow core photonic crystal fiber (HC-PCF) designs for broadband generation;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
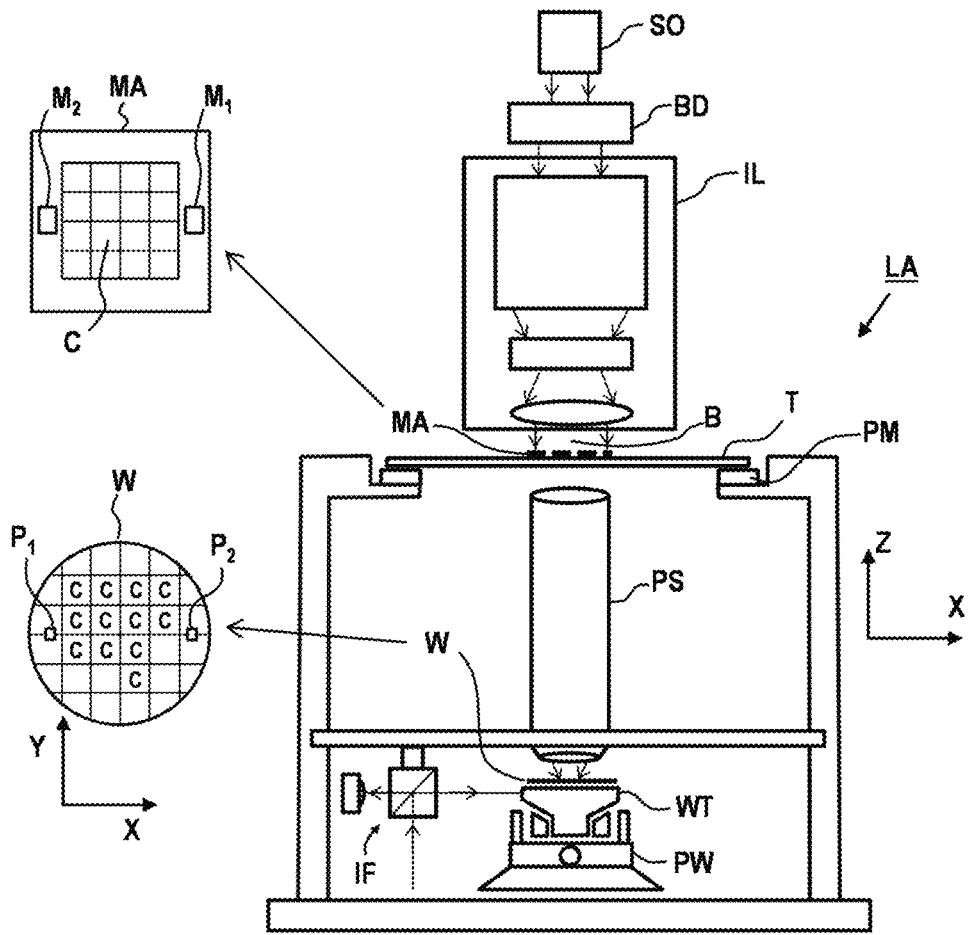
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein in its entirety by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using patterning device alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
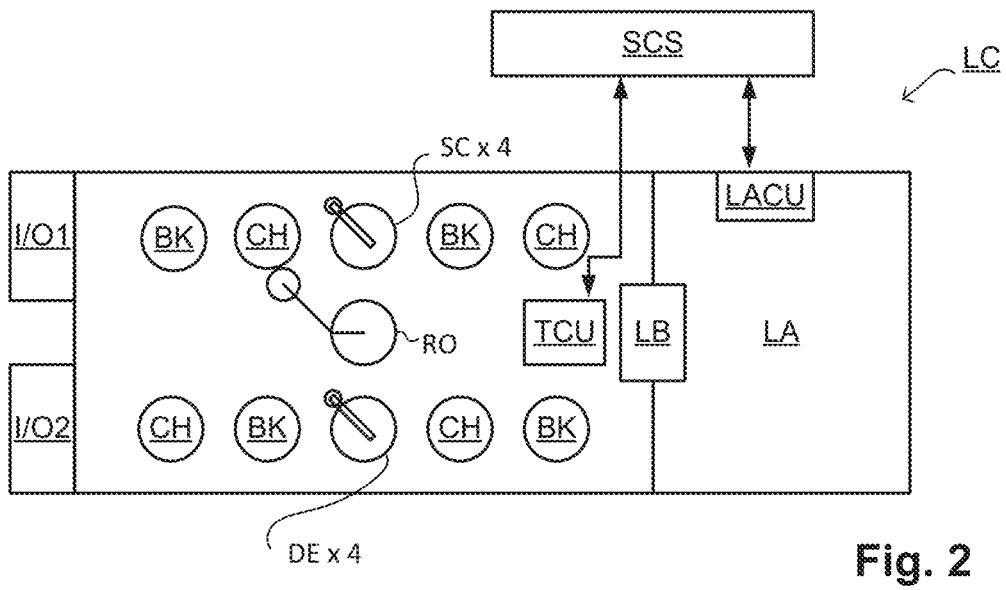
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include one or more spin coaters SC to deposit resist layers, one or more developers DE to develop exposed resist, one or more chill plates CH and/or one or more bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
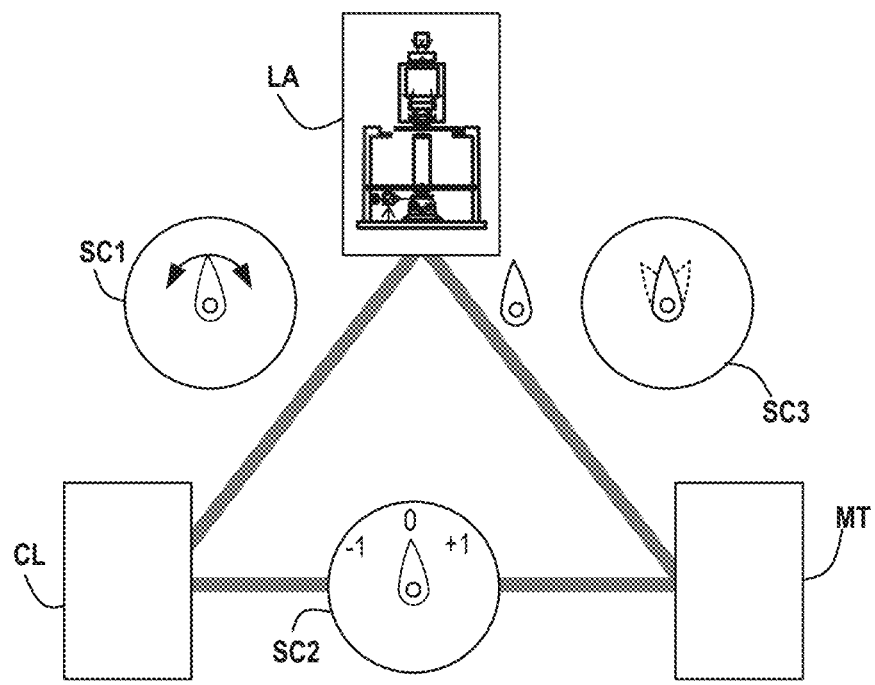
FIG. 3 depicts a schematic representation of holistic lithography, representing a cooperation between three technologies to optimize semiconductor manufacturing.

Typically the patterning process in a lithographic apparatus LA is one of the most critical steps in the processing which requires high accuracy of dimensioning and placement of structures on the substrate W. To help ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). An aspect of such a "holistic" environment is to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which patterning device layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in U.S. patent application publication nos. US20100328655, US2011102753, US20120044470, US20110249244, US20110026032 and European patent application publication no. EP1,628,164, each of which is incorporated herein in its entirety by reference. Metrology tools may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate one or more properties of the grating. Such reconstruction may, for example, result from simulating interaction of scattered radiation with a mathematical model of the target structure and comparing the simulation results with those of a measurement. One or more parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining one or more parameters of a lithographic process by measuring scattered radiation for each polarization state. Such a metrology apparatus emits polarized radiation (such as linear, circular, or elliptic) by using, for example, one or more appropriate polarization filters in the illumination section of the metrology apparatus. A source suitable for the metrology apparatus may provide polarized radiation as well. Various embodiments of existing ellipsometric scatterometers are described in U.S. Patent Application Publication Nos. 2007-0296960, 2008-0198380, 2009-0168062, 2010-0007863, 2011-0032500, 2011-0102793, 2011-0188020, 2012-0044495, 2013-0162996 and 2013-0308142, each of which is incorporated herein in its entirety by reference.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in European patent application publication no. EP1,628,164, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or U.S. patent application publication no. US 20160161863, each incorporated herein in its entirety by reference.

Other parameters of interest may be focus and dose. Focus and dose may be determined simultaneously by scatterometry (or alternatively by scanning electron microscopy) as described in U.S. patent application publication no. US2011-0249244, incorporated herein in its entirety by reference. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in U.S. patent application publication nos. US2016-0161863 and US 2016/0370717, each of which is incorporated herein in its entirety by reference.

Figure 4:
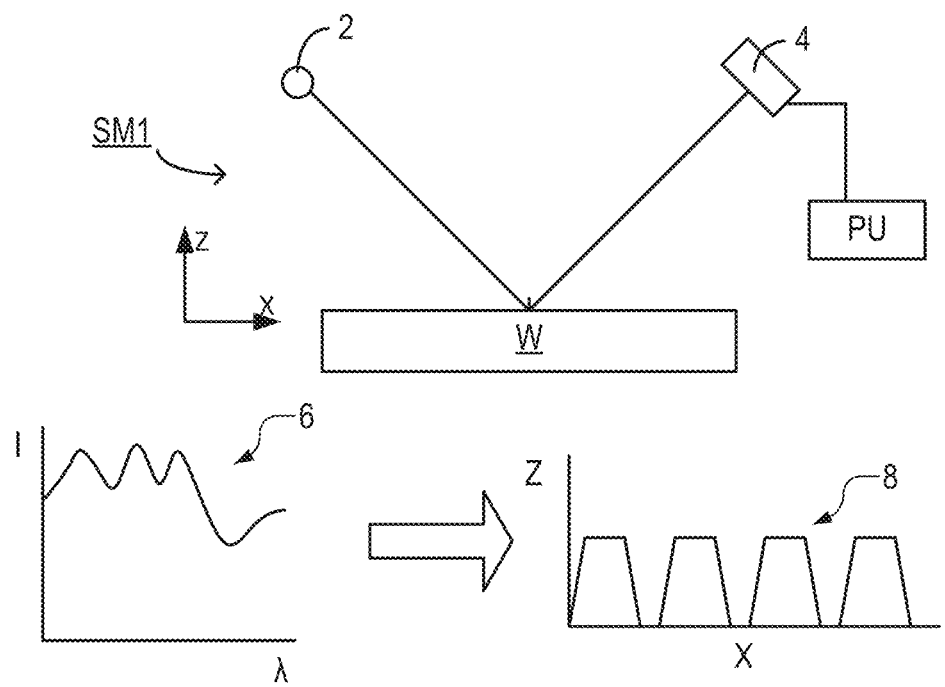
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application publication nos. US2016/0161863 and US 2016/0370717, each of which is incorporated herein in its entirety by reference.

Another type of metrology tool used in device manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
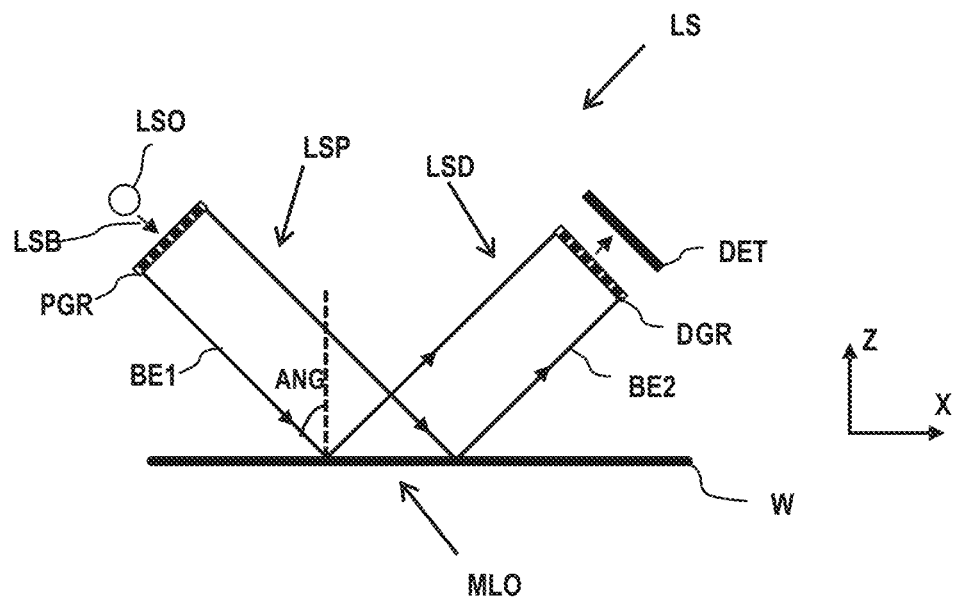
FIG. 5 depicts a schematic overview of a level sensor apparatus which may comprise a radiation source according to embodiments of the invention.

An example of a level or height sensor LS is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband light source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. patent nos. U.S. Pat. Nos. 7,265,364 and 7,646,471, both of which are incorporated herein in their entireties by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in device manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor for use in a lithographic apparatus is based on a self-referencing interferometer as described in U.S. Pat. No. 6,961,116, which is incorporated herein in its entirety by reference. Various enhancements and modifications of the position sensor have been developed, for example as disclosed in U.S. patent application publication no. US2015261097A1, which is incorporated herein in its entirety by reference.

Figure 6:
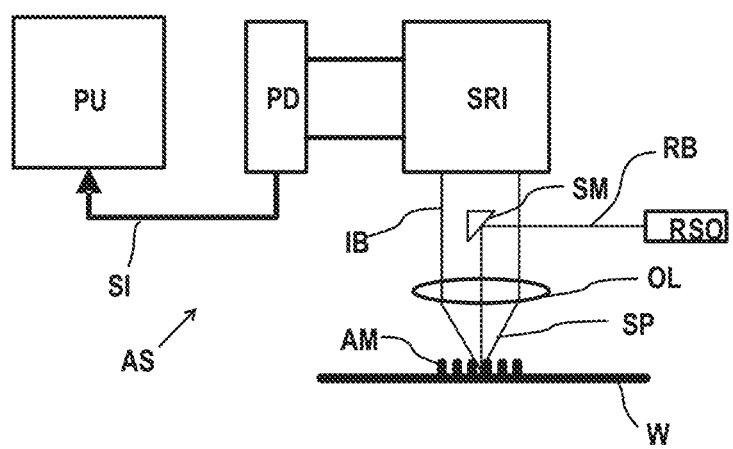
FIG. 6 depicts a schematic overview of an alignment sensor apparatus which may comprise a radiation source according to embodiments of the invention.

FIG. 6 is a schematic block diagram of an embodiment of an alignment sensor AS, such as is described, for example, in U.S. Pat. No. 6,961,116, which is incorporated herein in its entirety by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

A metrology tool (such as a scatterometer), topography measurement system, or position measurement system mentioned above may use radiation originating from a radiation source to perform a measurement. The properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation or pump radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, the broadband output radiation is created in a photonic crystal fiber (PCF). In several embodiments, such a photonic crystal fiber has microstructures around its fiber core assisting in confining radiation that travels through the fiber in the fiber core. The fiber core can be made of a solid material that has non-linear properties and that is capable of generating broadband radiation when high intensity pump radiation is transmitted through the fiber core. Although it is feasible to generate broadband radiation in solid core photonic crystal fibers, there may be a few disadvantages of using a solid material. For example, if UV radiation is generated in the solid core, this radiation might not be present in the output spectrum of the fiber because the radiation is absorbed by most solid material.

In some implementations, as discussed further below with reference to FIG. 8, methods and apparatuses for broadening input radiation may use a fiber for confining input radiation, and for broadening the input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a gas acting as a broadening medium for broadening input radiation. Such a fiber and gas arrangement may be used to create a supercontinuum radiation source. Radiation input to the fiber may be electromagnetic radiation, for example radiation in one or more of the infrared, visible, UV, and extreme UV spectra. The output radiation may consist of or comprise broadband radiation, which may be white light.

Some embodiments relate to a new design of such a broadband radiation source comprising an optical fiber. The optical fiber is a hollow-core, photonic crystal fiber (HC-PCF). In particular, the optical fiber may be a hollow-core, photonic crystal fiber of a type comprising anti-resonant structures for confinement of radiation. Such fibers comprising anti-resonant structures are known in the art as anti-resonant fibers, tubular fibers, single-ring fibers, negative curvature fibers or inhibited coupling fibers. Various different designs of such fibers are known in the art. Alternatively, the optical fiber may be photonic bandgap fibers (HC-PBFs, for example a Kagome fiber).

A number of types of HC-PCFs can be engineered, each based on a different physical guidance mechanism. Two such HC-PCFs include: hollow-core photonic bandgap fibers (HC-PBFs) and hollow-core anti-resonant reflecting fibers (HC-ARFs). Detail on the design and manufacture of HC-PCFs can be found in U.S. patent application publication no. US2004/015085 (for HC-PBFs) and PCT patent application publication no. WO2017/032454A1 (for HC-ARFs), which are incorporated herein in their entireties by reference. FIG. 9(a) shows a Kagome fiber, comprising a Kagome lattice structure.

An example of an optical fiber for use in the radiation source is now described with reference to FIG. 7, which is a schematic cross sectional view of the optical fiber OF in a transverse plane. Further embodiments similar to the practical example of the fiber of FIG. 7 are disclosed in PCT patent application publication no. WO2017/032454A1, which is incorporated herein in its entirety by reference.

The optical fiber OF comprises an elongate body, which is longer in one dimension compared to the other two dimensions of the fiber OF. This longer dimension may be referred to as an axial direction and may define an axis of the optical fiber OF. The two other dimensions define a plane which may be referred to as a transverse plane. FIG. 7 shows a cross-section of the optical fiber OF in this transverse plane (i.e. perpendicular to the axis), which is labelled as the x-y plane. The transverse cross-section of the optical fiber OF may be substantially constant along the fiber axis.

It will be appreciated that the optical fiber OF has some degree of flexibility and therefore the direction of the axis will not, in general, be uniform along the length of the optical fiber OF. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the optical fiber OF is flexed.

The optical fiber OF may have any length and it will be appreciated that the length of the optical fiber OF may be dependent on the application. The optical fiber OF may have a length between 1 cm and 10 m, for example, the optical fiber OF may have a length between 10 cm and 100 cm.

The optical fiber OF comprises: a hollow core HC; a cladding portion surrounding the hollow core HC; and a support portion SP surrounding and supporting the cladding portion. The optical fiber OF may be considered to comprise a body (comprising the cladding portion and the support portion SP) having a hollow core HC. The cladding portion comprises a plurality of anti-resonance elements for guiding radiation through the hollow core HC. In particular, the plurality of anti-resonance elements are arranged to confine radiation that propagates through the optical fiber OF predominantly inside the hollow core HC and to guide the radiation along the optical fiber OF. The hollow core HC of the optical fiber OF may be disposed substantially in a central region of the optical fiber OF, so that the axis of the optical fiber OF may also define an axis of the hollow core HC of the optical fiber OF.

The cladding portion comprises a plurality of anti-resonance elements for guiding radiation propagating through the optical fiber OF. In particular, in this embodiment, the cladding portion comprises a single ring of tubular capillaries CAP. Each of the tubular capillaries CAP acts as an anti-resonance element.

The capillaries CAP may also be referred to as tubes. The capillaries CAP may be circular in cross section, or may have another shape. Each capillary CAP comprises a generally peripheral wall portion WP that at least partially defines the hollow core HC of the optical fiber OF and separates the hollow core HC from a capillary cavity CC. It will be appreciated that the wall portion WP may act as an anti-reflecting Fabry-Perot resonator for radiation that propagates through the hollow core HC (and which may be incident on the wall portion WP at a grazing incidence angle). The thickness of the wall portion WP may be suitable so as to ensure that reflection back into the hollow core HC is generally enhanced whereas transmission into the capillary cavity CC is generally suppressed. In some embodiments, the capillary wall portion WP may have a thickness between 0.01-10.0 μm.

It will be appreciated that, as used herein, the term cladding portion is intended to mean a portion of the optical fiber OF for guiding radiation propagating through the optical fiber OF (i.e. the capillaries CAP which confine the radiation within the hollow core HC). The radiation may be confined in the form of transverse modes, propagating along the fiber axis.

The support portion is generally tubular and supports the capillaries CAP of the cladding portion. The capillaries CAP are distributed evenly around an inner surface of the inner support portion SP. The capillaries CAP may be described as being disposed in a generally hexagonal formation.

The capillaries CAP are arranged so that each capillary is not in contact with any of the other capillaries CAP. Each of the capillaries CAP is in contact with the inner support portion SP and spaced apart from adjacent capillaries CAP in the ring structure. Such an arrangement may be beneficial since it may increase a transmission bandwidth of the optical fiber OF (relative, for example, to an arrangement wherein the capillaries are in contact with each other). Alternatively, in some embodiments, each of the capillaries CAP may be in contact with adjacent capillaries CAP in the ring structure.

The capillaries CAP of the cladding portion are disposed in a ring structure around the hollow core HC. An inner surface of the ring structure of capillaries CAP at least partially defines the hollow core HC of the optical fiber OF. The cross-sectional width (e.g., diameter) d of the hollow core HC (which may be defined as the smallest dimension between opposed capillaries, indicated by arrow d) may be between 10 and 1000 μm. The cross-sectional width d of the hollow core HC may affect the mode field diameter, impact loss, dispersion, modal plurality, and non-linearity properties of the hollow core optical fiber OF.

In this embodiment, the cladding portion comprises a single ring arrangement of capillaries CAP (which act as anti-resonance elements). Therefore, a line in any radial direction from a center of the hollow core HC to an exterior of the optical fiber OF passes through no more than one capillary CAP.

It will be appreciated that other embodiments may be provided with different arrangements of anti-resonance elements. These may include arrangements having multiple rings of anti-resonance elements and arrangements having nested anti-resonance elements. FIG. 9(a) shows an embodiment of HC-PCFs with three rings of capillaries CAP stacking on top of each other along the radial direction. In this embodiment, each capillary CAP is in contact with other capillaries both in the same ring and in a different ring. Furthermore, although the embodiment shown in FIG. 7 comprises a ring of six capillaries, in other embodiments, one or more rings comprising any number of anti-resonance elements (for example 4, 5, 6, 7, 8, 9, 10, 11 or 12 capillaries) may be provided in the cladding portion.

FIG. 9(b) shows a modified embodiment of the above discussed HC-PCFs with a single ring of tubular capillaries. In the example of FIG. 9(b) there are two coaxial rings of tubular capillaries. For holding the inner and outer rings of tubular capillaries, a support tube ST may be included in the HC-PCF. The support tube may be made of silica.

The tubular capillaries of the examples of FIG. 7 and FIGS. 9(a) and (b) may have a circular cross-sectional shape. Other shapes are also possible for the tubular capillaries, like elliptical or polygonal cross-sections. Additionally, the solid material of the tubular capillaries of the examples of FIG. 7 and FIGS. 9(a) and (b) may comprise plastic material, like PMA, glass, like silica, or soft glass.

FIG. 8 depicts a radiation source RDS for providing broadband output radiation. The radiation source RDS comprises a pulsed pump radiation source PRS or any other type of source that is capable of generating short pulses of a desired length and energy level; an optical fiber OF (for example of the type shown in FIG. 7) with a hollow core HC; and a working medium WM (for example a gas) disposed within the hollow core HC. Although in FIG. 8 the radiation source RDS comprises the optical fiber OF shown in FIG. 7, in alternative embodiments other types of hollow core optical fiber OF may be used.

The pulsed pump radiation source PRS is configured to provide input radiation IRD. The hollow core HC of the optical fiber OF is arranged to receive the input radiation IRD from the pulsed pump radiation source PRS, and broaden it to provide output radiation ORD. The working medium WM enables the broadening of the frequency range of the received input radiation IRD so as to provide broadband output radiation ORD.

The radiation source RDS further comprises a reservoir RSV. The optical fiber OF is disposed inside the reservoir RSV. The reservoir RSV may also be referred to as a housing, container or gas cell. The reservoir RSV is configured to contain the working medium WM. The reservoir RSV may comprise one or more features, known in the art, for controlling, regulating, and/or monitoring the composition of the working medium WM (which may be a gas) inside the reservoir RSV. The reservoir RSV may comprise a first transparent window TW1. In use, the optical fiber OF is disposed inside the reservoir RSV such that the first transparent window TW1 is located proximate to an input end IE of the optical fiber OF. The first transparent window TW1 may form part of a wall of the reservoir RSV. The first transparent window TW1 may be transparent for at least the received input radiation frequencies, so that received input radiation IRD (or at least a large portion thereof) may be coupled into the optical fiber OF located inside reservoir RSV. It will be appreciated that optics (not shown) may be provided for coupling the input radiation IRD into the optical fiber OF.

The reservoir RSV comprises a second transparent window TW2, forming part of a wall of the reservoir RSV. In use, when the optical fiber OF is disposed inside the reservoir RSV, the second transparent window TW2 is located proximate to an output end OE of the optical fiber OF. The second transparent window TW2 may be transparent for at least the frequencies of the broadband output radiation ORD of the apparatus.

Alternatively, in another embodiment, the two opposed ends of the optical fiber OF may be placed inside different reservoirs. The optical fiber OF may comprise a first end section configured to receive input radiation IRD, and a second end section for outputting broadband output radiation ORD. The first end section may be placed inside a first reservoir, comprising a working medium WM. The second end section may be placed inside a second reservoir, wherein the second reservoir may also comprise a working medium WM. The functioning of the reservoirs may be as described in relation to FIG. 8 above. The first reservoir may comprise a first transparent window, configured to be transparent for input radiation IRD. The second reservoir may comprise a second transparent window configured to be transparent for broadband output broadband radiation ORD. The first and second reservoirs may also comprise a sealable opening to permit the optical fiber OF to be placed partially inside and partially outside the reservoir, so that a gas can be sealed inside the reservoir. The optical fiber OF may further comprise a middle section not contained inside a reservoir. Such an arrangement using two separate gas reservoirs may be particularly convenient for embodiments wherein the optical fiber OF is relatively long (for example when the length is more than 1 m). It will be appreciated that for such arrangements which use two separate gas reservoirs, the two reservoirs (which may comprise one or more features, known in the art, for controlling, regulating, and/or monitoring the composition of a gas inside the two reservoirs) may be considered to provide an apparatus for providing the working medium WM within the hollow core HC of the optical fiber OF.

In this context a window may be transparent for a frequency if at least 50%, 75%, 85%, 90%, 95%, or 99% of incident radiation of that frequency on the window is transmitted through the window.

Both the first TW1 and the second TW2 transparent windows may form a gastight seal within the walls of the reservoir RSV so that the working medium WM (which may be a gas) may be contained within the reservoir RSV. It will be appreciated that the gas WM may be contained within the reservoir RSV at a pressure different to the ambient pressure of the reservoir RSV.

The working medium WM may comprise a noble gas such as argon, krypton, and/or xenon, a Raman active gas such as hydrogen, deuterium and/or nitrogen, or a gas mixture such as an argon/hydrogen mixture, a xenon/deuterium mixture, a krypton/nitrogen mixture, or a nitrogen/hydrogen mixture. Depending on the type of filling gas, the nonlinear optical processes can include modulational instability (MI), soliton self-compression, soliton fission, Kerr effect, Raman effect and dispersive wave generation, details of which are described in PCT patent application publication no. WO2018/127266A1 and U.S. Pat. No. 9,160,137 (both of which are hereby incorporated in their entireties by reference). Since the dispersion of the filling gas can be tuned by varying the working medium WM pressure in the reservoir RSV (i.e. gas cell pressure), the generated broadband pulse dynamics and the associated spectral broadening characteristics can be adjusted so as to optimize the frequency conversion In one implementation, the working medium WM may be disposed within the hollow core HC at least during receipt of input radiation IRD for producing broadband output radiation ORD. It will be appreciated that, while the optical fiber OF is not receiving input radiation IRD for producing broadband output radiation, the gas WM may be wholly or partially absent from the hollow core HC.

In order to achieve frequency broadening high intensity radiation may be desirable. An advantage of having a hollow core optical fiber is that it may achieve high intensity radiation through strong spatial confinement of radiation propagating through the optical fiber, achieving high localized radiation intensities. The radiation intensity inside the optical fiber may be high, for example due to high received input radiation intensity and/or due to strong spatial confinement of the radiation inside the optical fiber. An advantage of hollow core optical fibers is that they can guide radiation having a broader wavelength range that solid-core fibers and, in particular, hollow core optical fibers can guide radiation in both the ultraviolet and infrared ranges.

An advantage of using a hollow core optical fiber may be that the majority of the radiation guided inside the optical fiber is confined to the hollow core. Therefore, the majority of the interaction of the radiation inside the optical fiber is with the working medium, which is provided inside the hollow core of the optical fiber. As a result, the broadening effects of the working medium on the radiation may be increased.

The received input radiation may be electromagnetic radiation. The input radiation may be received as pulsed radiation. For example, the input radiation may comprise ultrafast pulses, for example, generated by a laser.

The input radiation may be coherent radiation. The input radiation may be collimated radiation, an advantage of which may be to facilitate and improve the efficiency of coupling the input radiation into the optical fiber. The input radiation may comprise a single frequency, or a narrow range of frequencies. The input radiation may be generated by a laser. Similarly, the output radiation may be collimated and/or may be coherent.

The broadband range of the output radiation may be a continuous range, comprising a continuous range of radiation frequencies. The output radiation may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation may comprise for example electromagnetic radiation over a wavelength range of 100 nm-4000 nm. The broadband output radiation ORD wavelength range may be for example 400 nm-900 nm, 500 nm-900 nm, or 200 nm-2000 nm or a selected range selected from 10 nm to 500 nm (such as more than or equal to about 200 nm, more than or equal to about 300 nm or more than or equal to about 400 nm), the selected range selected from the wavelength range of 100 nm-4000 nm. The supercontinuum output radiation may comprise white light.

The input radiation provided by the pulsed pump radiation source may be pulsed. The input radiation may comprise electromagnetic radiation of one or more frequencies between 200 nm and 2 μm. The input radiation may for example comprise electromagnetic radiation with a wavelength of 1.03 μm. The repetition rate of the pulsed radiation may be of an order of magnitude of 1 kHz to 100 MHz. The pulse energies may have an order of magnitude of 0.1 μJ to 100 μJ, for example 1-10 μJ. A pulse duration for the input radiation may be between 10 fs and 10 ps, for example 300 fs. The average power of input radiation may be between 100 mW to several 100 W. The average power of input radiation may for example be 20-50 W.

The pulsed pump radiation source PRS may be a laser. The spatio-temporal transmission characteristics of such a laser pulse, e.g. its spectral amplitude and phase, transmitted along the optical fiber can be varied and tuned through adjustment of one or more (pump) laser parameters, one or more working component variations, and/or one or more optical fiber parameters. The one or more spatio-temporal transmission characteristics may include one or more selected from: output power, output mode profile, output temporal profile, width of the output temporal profile (or output pulse width), output spectral profile, and/or bandwidth of the output spectral profile (or output spectral bandwidth). The one or more pulse pump radiation source parameters may include one or more selected from: pump wavelength, pump pulse energy, pump pulse width, and/or pump pulse repetition rate. The one or more optical fiber parameters may include one or more selected from: optical fiber length, size and/or shape of the hollow core, size and/or shape of the capillaries, and/or thickness of the walls of the capillaries surrounding the hollow core. The one or more working component, e.g. filling gas, parameters may include one or more selected from: gas type, gas pressure and/or gas temperature.

The broadband output radiation provided by the radiation source may have an average output power of at least 1 W. The average output power may be at least 5 W. The average output power may be at least 10 W. The broadband output radiation may be pulsed broadband output radiation. The broadband output radiation may have a power spectral density in the entire wavelength band of the output radiation of at least 0.01 mW/nm. The power spectral density in the entire wavelength band of the broadband output radiation may be at least 3 mW/nm.

HC-PCF based broadband radiation sources often suffer from fast performance degradation and short lifetime issues. At present, several failure mechanisms have been identified. A first failure mechanism is fiber contamination typically induced by hydrocarbon deposition on one or both fiber ends. Hydrocarbons may be brought into the reservoir RSV when the radiation source is assembled. Hydrocarbons may also be produced by thermal outgassing of the components inside the reservoir RSV, including the optical fiber itself.

A second failure mechanism is fiber overheating. White light generation is accompanied by ionization and heat generation through atomic collisions in gas species and recombination dynamics in plasma. Such heat generated during operation will increase the temperature of the inner cladding surfaces of an optical fiber. However, for certain HC-PCFs e.g., such as illustrated in FIG. 7, 9(a) or 9(b), fiber geometries do not allow access and efficient cooling of the surfaces of inner cladding waveguide structures. Without effective thermal dissipation, the generated heat will accumulate within the fiber, especially in the case of the fiber being pumped/driven with high repetition rate pulses, until the fiber is overheated and eventually damaged. Overheating of the surfaces of an inner cladding waveguide structure (e.g., tubular capillaries such as illustrated in FIG. 7, 9(a) or 9(b)) will also trigger unwanted chemical reactions which can produce outgassing and thus cause further contamination.

A third failure mechanism is hydrogen induced fiber surface reduction and glassy growth. It has been found that after operating a HC-PCF based broadband radiation source with a hydrogen containing gas mixture for over a few hundred hours, silicon oxides or $SiO_x$ nanostructures and fluffy glass are grown predominantly at the output tip of the fiber. One of the main root causes of the silicon dioxide growth is reduction of the inner fiber surfaces in the presence of hydrogen plasma. Reduction and etching of silicon dioxide in the presence of hydrogen plasma is a known phenomenon. Hydrogen ions and radicals, such as atomic hydrogen, attack the inner fiber surfaces and cause the reduction of the contacting surfaces by converting silica to silicon, or cause etching of the surfaces by creating volatile silicon monoxide. The growth of silicon dioxide at the end tip of a fiber results in gradual blockage and loss of output power, which will eventually lead to fiber damage and short lifetime of the broadband radiation source.

At present, various measures have been taken individually or in combination to reduce the degradation of HC-PCFs and thus extend the lifetime of HC-PCF based radiation sources. For example, better cleaning methods are used to clean all the components of a HC-PCF based radiation source, in particular those contained in the reservoir RSV. Moreover, components that are made of materials with low outgassing properties are preferred over equivalents that are made of materials with high outgassing properties. In addition, gas mixtures with a higher thermal conductivity are used to help improve thermal dissipation within HC-PCFs. Although the above measures are effective to a certain extent, fiber damage is still difficult to prevent.

Due to the aforementioned fiber lifetime issues, a HC-PCF based radiation source may fail to function after only a short period of operation time. In the case where a HC-PCF based radiation source is used in a metrology tool, e.g., a scatterometer, topography measurement system, or position measurement system mentioned above, unexpected and/or early failures of a HC-PCF means the whole radiation source will need to be removed from the tool in order to be repaired or replaced. Replacement of a damaged/degraded fiber requires re-optimization of coupling of the pump laser beam into a new HC-PCF, which is a time-consuming process. After a repaired or replacement radiation source is fitted into the same metrology tool, a complete optical alignment of the radiation beam emitted from the radiation source and other necessary calibrations and characterizations need to be carried out again. The whole process not only adds cost but also causes a significant system downtime.

As described above, in a HC-ARF, the cladding portion comprising a plurality of anti-resonance elements, such as tubular capillaries, is used for guiding radiation through the hollow core. A low loss transmission window of a given HC-ARF is formed between fiber resonances. Within the low loss transmission window, cladding modes that are supported by the anti-resonance elements, e.g., tubular capillaries, are not phase matched to the core mode i.e., the core mode and cladding modes are anti-resonant, which ensures that the core mode is propagating predominantly within the hollow core. Whereas, within each fiber resonance band, the core mode is phase matched to the cladding modes, i.e. the core mode and cladding modes are resonant, which results in strong coupling of the core mode into the anti-resonance elements. Consequently, the corresponding portion of the radiation is no longer guided in the hollow core. The strong coupling of the core mode into the surrounding cladding structure can exacerbate the above-described overheating issue and thus shorten the fiber lifetime. Hence to reduce the interaction between the core mode and the cladding structure, it is desirable to optimize the output spectrum such that its overlap with the fiber resonances is minimized.

For some HC-ARFs, such as those shown in FIG. 7, 9(a) or 9(b), the spectral positions of the fiber resonances are determined by the core-wall thickness (e.g., thickness of the tubular capillaries) and geometry of the surrounding cladding structure (e.g., arrangement of the tubular capillaries). The fiber resonances cannot be eliminated and must be managed in order to optimize for a given spectral bandwidth. The geometry and core-wall thickness, as well as the HC-PCF material, cannot be changed once the fiber has been fabricated. To change the positions of the fiber resonances requires changing one or more of the foregoing fiber parameters, and therefore the use of a different fiber. The lack of flexibility in controlling of post-fabrication fiber resonances imposes stringent requirements on the fiber fabrication process, which inevitably results in higher manufacturing costs.

Existing HC-PCF based broadband radiation sources are typically based on a single-fiber configuration, e.g., the example shown in FIG. 8. In order to meet a growing need of large bandwidths, HC-PCFs with multi-octave spanning spectral bandwidths, e.g., from deep ultraviolet (UV) to near-infrared (NIR), are desirable. However, such large bandwidth HC-PCFs are very difficult to fabricate and require precise control of the fiber fabrication process which limits production yield and increases manufacturing costs.

Embodiments described below relate to methods and apparatuses which are capable of mitigating one or more of the aforementioned or other short lifetime issues and/or simultaneously allowing desired flexibility to tune or optimize spectral characteristics of the output radiation (e.g., bandwidth and/or location of the output spectrum) that is otherwise unachievable by existing single-fiber based radiation sources. A concept of the method is to use more than one optical fiber OF, e.g., HC-PCFs, arranged in a desired manner such that a current optical fiber OF can be automatically and/or quickly replaced with a new optical fiber having either substantially the same fiber parameters as the current optical fiber OF or other different fiber parameters in order to obtain different output characteristics, e.g., different fiber resonances and/or spectral bandwidths. This method allows multiple optical fibers OF to be switched in an automated and non-invasively manner and therefore obviates the need of following the existing time-consuming fiber replacement process, e.g., removing the current optical fiber OF from the reservoir RSV, placing a new optical fiber OF into the reservoir, and coupling the input radiation into the new optical fiber OF.

In embodiments, the number of fibers in a fiber assembly may comprise for example, between: 2 and 100 optical fibers, 2 and 50 optical fibers, 2 and 30 optical fibers, 5 and 100 optical fibers, 5 and 50 optical fibers, 5 and 30 optical fibers, 10 and 100 optical fibers, or 10 and 50 optical fibers. The arrangement may be a 1-dimensional (1D) array, a 2D array, an irregular 1D or 2D arrangement, a circular arrangement or any other arrangement. The optical fibers may be all substantially similar, or at least one or more subsets may comprise different properties.

Figure 10A:
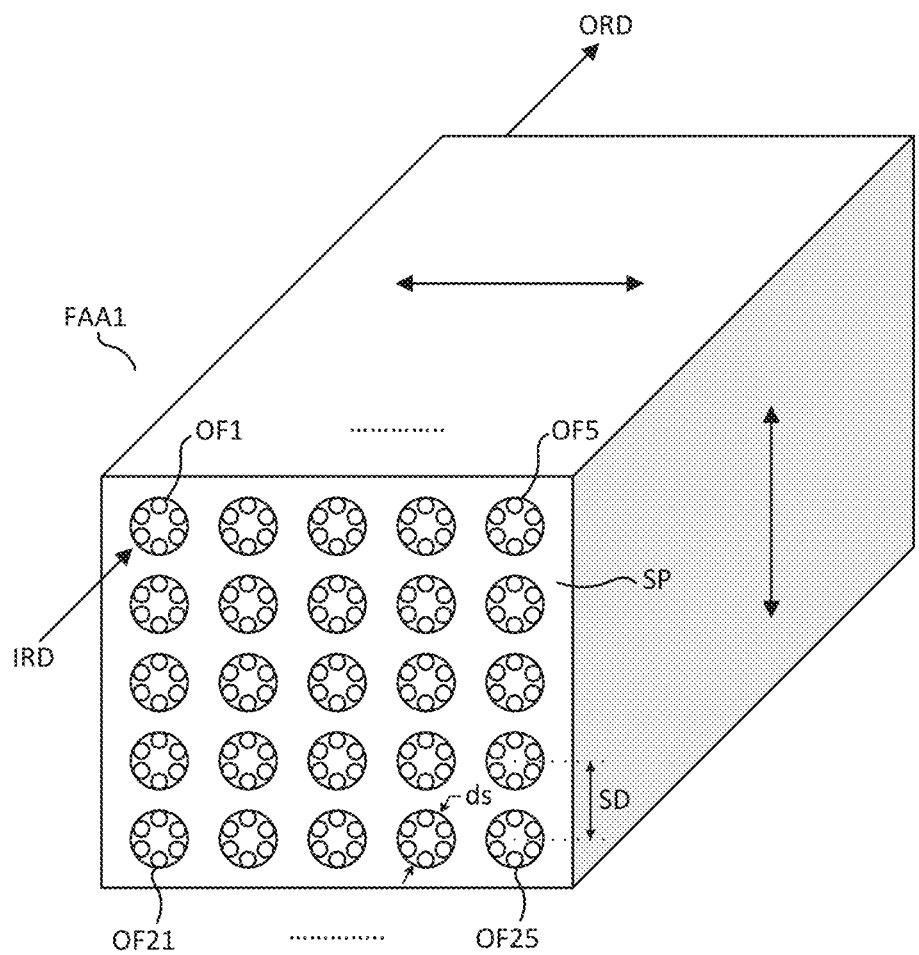
FIG. 10(a) schematically illustrates a rectangular fiber assembly which comprises a two-dimensional (2D) array of optical fibers (e.g., single-ring HC-PCFs) in accordance with an embodiment.

FIG. 10(a) schematically illustrates a rectangular fiber assembly FAA1 which comprises a two-dimensional (2D) array of optical fibers (e.g., single-ring HC-PCFs) in accordance with an embodiment. In the specific embodiment shown, the fiber assembly FAA1 may be a multi-cored microstructured fiber comprising a number of separate cores of HC-PCFs OF1-OF25 (in this example, 25 HC-PCFs). The separate hollow cores HC may be formed within a single support portion SP. Note that the fiber assembly FAA1 may comprise any number and/or any type of optical fibers OF which may be determined based on application needs and/or practicalities of implementation.

The spatial distance DS between the centers of two neighboring hollow cores HC may be at least greater than inner cross-sectional width (e.g., diameter) ds of the support portion SP of each HC-PCF that supports in direct contact with the (six) tubular capillaries. As such, any two HC-PCFs may be spatially separated. In some embodiments, the spatial distance DS between any two HC-PCFs may be sufficiently large such that an adjacent optical fiber OF may be less or not affected by e.g., outgassing and/or glassy (silica) growth generated from a neighboring optical fiber OF. The spatial distance DS may be for example up to 2, up to 3, up to 4, or up to 5 times the inner cross-sectional width ds of the support portion of each HC-PCF.

Figure 10B:
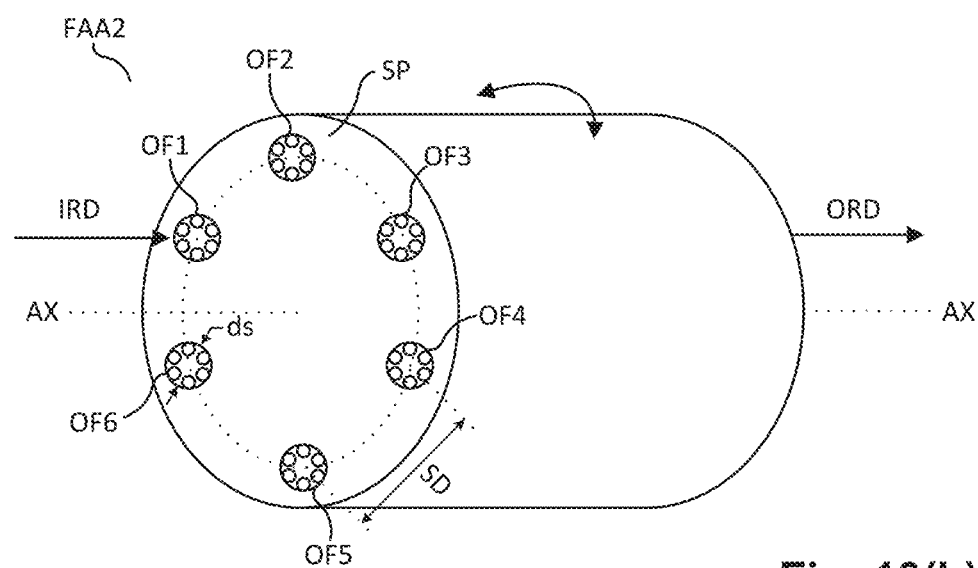
FIG. 10(b) schematically illustrates a circular fiber assembly which comprises a two-dimensional (2D) array of optical fibers (e.g., single-ring HC-PCFs) in accordance with an embodiment.

FIG. 10(b) schematically illustrates a circular fiber assembly FAA2 which comprises a two-dimensional (2D) arrangement of optical fibers OF (e.g., single-ring HC-PCFs) in accordance with an embodiment. In this specific example, the fiber assembly FAA2 comprises a number of HC-PCFs OF1-OF6 (in this example, 6 HC-PCFs) arranged in a single ring geometry. It should be appreciated that in different embodiments, the circular fiber assembly FAA2 may comprise multiple concentric rings of optical fibers OF. On each fiber ring, there may be any number of optical fibers OF which may be determined based on application needs and/or practicalities of implementation. All the optical fibers OF comprised in each fiber ring may have a same radial distance to the axis AX of the fiber assembly FAA2. Similar to the embodiment shown in FIG. 10(a), the spatial distance DS between the centers of two neighboring hollow cores HC may be at least greater than inner cross-sectional width ds of the support portion of each HC-PCF which supports or is in direct contact with the (six) tubular capillaries. The spatial distance DS may be for example up to 2, up to 3, up to 4, or up to 5 times the inner cross-sectional width ds of the support portion of each HC-PCF.

Both of the fiber assemblies FAA1, FAA2 shown in FIGS. 10(a) and 10(b) may be manufactured using standard multi-core fiber fabrication techniques, such as, for example, the so-called stack and draw technique. This three (or more) step process comprises: stacking multiple glass tubes into a glass preform, drawing the preform down into a cane with smaller transverse dimensions and further drawing the cane into a fiber. A fiber assembly composed of multiple hollow-core fibers can be directly fabricated based on a variation of this method, more specifically by including the additional step of stacking the canes together before fiber drawing.

Instead of using fiber assemblies which are based on a directly fabricated multi-core microstructured fiber, other types of fiber assemblies may be based on assembling a plurality of individual single-core fibers. Such fiber assemblies may have advantages in allowing for more flexibility in choosing optical fibers and obviating some fabrication difficulties for directly manufacturing a single multi-core microstructured fiber.

Figure 11A:
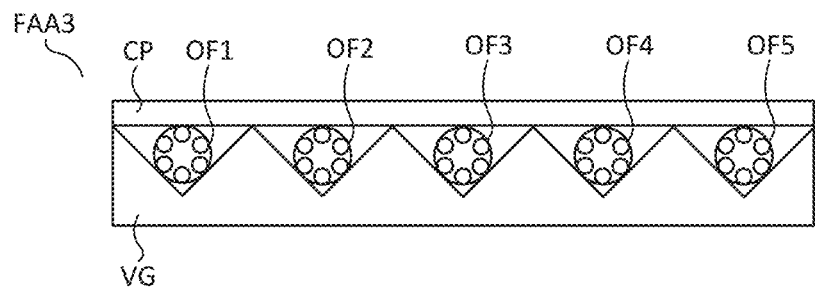
FIG. 11(a) illustrates a 1D fiber assembly using individual single-core optical fibers in accordance with an embodiment.
Figure 11B:
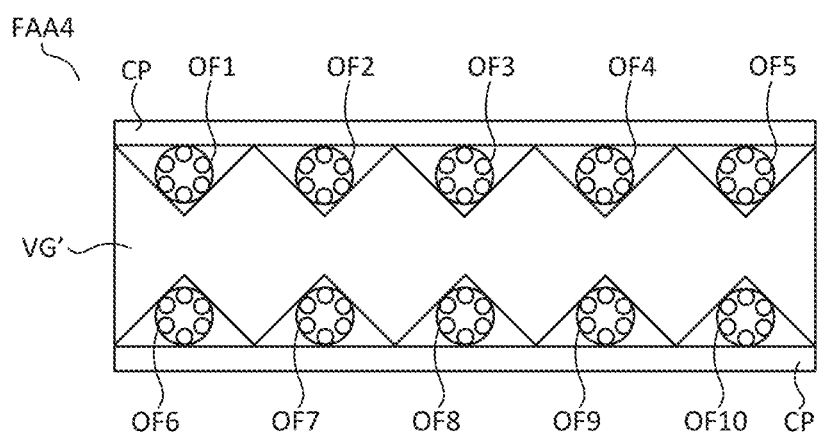
FIG. 11(b) illustrates a 2D fiber assembly using individual single-core optical fibers in accordance with an embodiment.

FIGS. 11(a) and 11(b) respectively illustrate a 1D and a 2D fiber assembly FAA3, FAA4 using individual single-core optical fibers in accordance with an embodiment. The fiber assemblies FAA3, FAA4 may be obtained by assembling together a plurality of individual single-core optical fibers OF, e.g., HC-PCFs, and arranging them into a fiber array. The size of the fiber array and thus the total number of the optical fibers OF may be flexibly chosen depending on applications.

With reference to FIG. 11(a), the fiber assembly FAA3 may comprise a 1D fiber array with (in this specific example) five optical fibers OF1-OF5. The five optical fibers OF1-OF5 may be five HC-PCFs and optionally may be derived from a single HC-PCF and hence possess substantially the same fiber properties. Alternatively, the five HC-PCFs may come from two or more different HC-PCFs and thus at least two of the HC-PCFs may possess different fiber properties. The five HC-PCFs may be held by a V-groove mount VG having a 1D array of v-grooves and a fiber clamp CP. Each V-groove may hold a single fiber. When the clamp CP is fixed on top of the V-groove mount VG, it may be in physical contact with the five HC-PCFs and may exert a suitable clamping force to them. The strength of the clamping force may be adjustable by varying the depth of the V-grooves. The clamping force may fix each HC-PCF in position by pushing them against the wall of respective V-grooves. In some embodiments, fiber sleeves may be used in locations where the clamp CP is in contact with the fibers in order to reduce or minimize the clamping force induced stress to the fibers.

With reference to FIG. 11(b), the fiber assembly FAA4 may comprise a 2D fiber array with (in this specific example) ten optical fibers OF1-OF10. The ten optical fibers OF1-OF10 may be ten HC-PCFs which may be derived from a single HC-PCF and hence possess substantially the same fiber properties. Alternatively, the ten HC-PCFs may come from two or more different HC-PCFs and thus some fibers may possess substantially the same fiber properties while others may possess different fiber properties, or all may be different. For example, the five HC-PCFs OF1-OF5 in the top row may have one fiber structure while the five HC-PCFs OF6-OF10 in the bottom row may have a different fiber structure. Depending on applications, other different fiber combinations may be used in the fiber assembly FAA4. The HC-PCFs may be held by a V-groove mount VG' having a corresponding 2D array of v-grooves and two fiber clamps CP. Each V-groove may hold a single fiber. The two fiber clamps may be attached respectively to the top and bottom surfaces of the V-groove mount VG' so as to fix all the optical fibers OF1-OF10 in position.

Note that, the above described 1D or 2D V-groove mount is only an example fiber holder; other different types of fiber holders may be equally applicable. In some embodiments, a single glass substrate comprising a 1D or 2D array of cylindrical holes may be used as the fiber array holder. Each of the cylindrical holes may hold a single optical fiber OF, e.g., HC-PCF. After all the fibers are placed respectively into the cylindrical holes, they may be fixed to their respective cylindrical holes by means of e.g., laser joining or adhesive.

Figure 12:
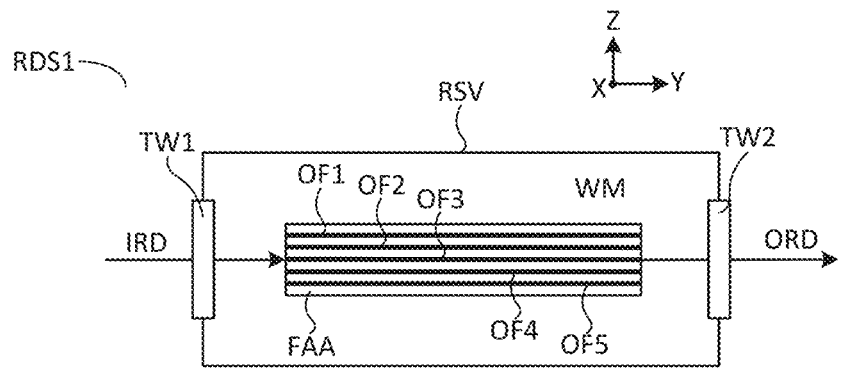
FIG. 12 schematically illustrates a broadband radiation source comprising a fiber assembly in accordance with an embodiment and a single beam configuration.

FIG. 12 schematically illustrates a broadband radiation source RDS1 arrangement comprising a fiber assembly FAA in accordance with an embodiment and a first single input beam configuration. The fiber assembly FAA may be for example any one of the above described fiber assemblies FAA1-FAA4. In operation, one of the HC-PCFs (e.g., OF3) may be aligned with the optical axis of the radiation source RDS. Within the reservoir RSV, the optical axis of the radiation source RDS may be the beam path of the input radiation IRD. In some embodiments, only one of the HC-PCFs of the fiber assembly FAA may be used to generate broadband radiation at any given time. When a current HC-PCF has reached its lifetime (e.g., performance has degraded to a certain threshold level, damage has occurred) or a different output characteristic is desired, a neighboring or a selected new HC-PCF (e.g., OF4) may be (e.g., automatically) placed into the beam path of the input radiation IRD by (vertically) translating the fiber assembly FAA with respect to the (e.g., fixed) beam path of the input radiation IRD. In case of the fiber assembly FAA2 being used in the radiation source RDS1, a neighboring or a selected new HC-PCF (e.g., OF4) may be (e.g., automatically) placed into the beam path of the input radiation IRD by rotating the fiber assembly FAA2 about its axis AX. Alternatively or additionally, fiber core switching may also be achievable by shifting the beam path of the input radiation IRD with respect to the (e.g., fixed) fiber assembly FAA. In some embodiments, both the beam path of the input radiation IRD and the position or orientation of the fiber assembly FAA may be adjusted together in order to achieve fiber core switching.

With reference to FIG. 12, in the case where fiber core switching is achieved solely via translation of the fiber assembly FAA, the fiber assembly FAA may be mounted on a stage module (not shown) comprising one or more actuators (e.g., electromagnetic actuators). The stage module may provide the fiber assembly FAA with multiple (e.g., six) degrees of freedom movement. In this particular embodiment where a linear 1D fiber array is used, the stage module may comprise three linear motion actuators that provide precision movement in the X, Y and Z directions, and two rotary actuators that provide precision angular tilting in the sagittal (tilting about the X direction Rx) and tangential plane (tilting about the Z direction Rz). The X, Y and Z directions are defined with respect to the co-ordinate system shown in FIG. 12. The linear actuators may provide a spatial resolution of e.g., less than or equivalent to one micrometer and the rotary actuators may have an angular resolution of e.g., less than or equivalent to one microradian. The travel and angular tilting range may be sufficiently large to cover all the fibers in the fiber assembly FAA. In some embodiments, in addition to high precision linear actuators, the stage module may further comprise coarse movement actuators which are responsible for low precision but long distance movement. When the fiber assembly FAA needs to be replaced (e.g., when all the fibers are damaged or degraded), the coarse movement actuators may be used to ensure the relative position difference between the new fiber assembly FAA and the beam of input radiation IRD is within the travel range of high precision linear actuators.

Whenever a current optical fiber OF is due for replacement, the input radiation IRD may be at least partially blocked by means of e.g., a beam block. The stage module may translate the fiber assembly FAA so as to substantially align the hollow core HC of a new optical fiber OF with the beam path of the input radiation IRD. The distance of the movement may be predetermined based on the spatial separation between any two neighboring fiber cores. Once the new optical fiber OF is moved to the target position, attenuated or full input radiation IRD may be allowed to enter the hollow core HC of the new fiber and broadband output radiation ORD may be generated. Subsequently, the radiation source RDS1 may enter an input coupling optimization mode in which the coupling between the input radiation IRD and the hollow core HC of the new fiber is optimized. The input coupling optimization may be evaluated by monitoring certain optical characteristics of the output radiation, e.g., spectrum and/or power of the output radiation ORD while adjusting the position of the fiber assembly FAA.

The optimization routine may involve for example fine scanning of the position of the fiber assembly FAA in the X, Y and Z direction sequentially. For example, the stage module may be commanded to scan the position of the fiber assembly FAA first in the X-Z plane to optimize the transverse overlapping between the input radiation IRD and the hollow core HC. Subsequently, the stage module may be commanded to scan the position of the fiber assembly FAA in the Y direction to optimize the focus position of the input radiation IRD into the hollow core HC. In some embodiments, the stage module may be commanded to tilt the fiber assembly FAA in Rx and/or Rz directions in order to further optimize the fiber coupling of the input radiation IRD. As soon as the input coupling optimization is complete, the radiation source RDS1 may enter a normal operating mode in which the position of the fiber assembly FAA is fixed for operation. Note that, it may be that the input coupling optimization is carried out only once when a new fiber assembly FAA is installed. After the initial input coupling optimization, subsequent fiber core switching may be done repeatably without a need for further optimization. However, the input coupling optimization may be repeated any time where required (e.g., for fault-finding purposes). For example, when the optical characteristics (e.g., spectrum and/or power) of the output radiation ORD generated from a new fiber are significantly different from either predefined values or those generated by a previous identical fiber before its degradation/damage, the input coupling optimization may be used to verify whether the performance loss is due to fiber coupling of the input radiation IRD.

In some embodiments, all of the optical fibers OF comprised within the fiber assembly FAA may have substantially the same fiber properties and therefore lead to substantially the same output optical characteristics. The fiber core switching may be initiated when a current optical fiber is either already damaged or at the verge of damage (e.g., judged by existing performance degradation). Since the HC-PCFs are typically regarded as a lifetime limiting component of a HC-PCF based broadband radiation source RS, a fiber assembly FAA comprising a redundant collection of multiple copies (e.g., 5 copies) of a particular fiber structure can significantly extend (e.g., 5 times) the overall lifetime of the radiation source RS.

In different embodiments, some or all of the optical fibers OF may have different fiber properties/structures which lead to different output optical characteristics. In the case of a 2D fiber assembly, for example assembly FAA1 of FIG. 10(a), being used in the radiation source RDS1 of FIG. 12, the optical fibers OF in each column may have the substantially the same fiber properties while the optical fibers OF in each row may have different fiber properties. The difference in fiber properties between fibers in a row may be arranged in a customized manner such that the output optical characteristics from each or one or more of the different fiber cores may be optimized and/or complemental to those from other fibers.

In an embodiment, HC-PCFs in each column may have substantially the same fiber properties which may be different to those of the fibers in a different column, so as to provide radiation with a different radiation characteristic. As such, the output radiation generated from a fiber in a specific column may be optimized in a specific spectral range. For example, the output radiation ORD from the fibers in the first column, e.g., the left-most column of the fiber assembly FAA in FIG. 12, may be optimized in the spectral range between 200 nm and 800 nm, the fibers in the second column, i.e. the column next to the first column, may be optimized in the spectral range between 600 nm and 1200 nm, the fibers in the third column may be optimized in the spectral range between 1000 nm and 1600 nm, the fibers in the fourth column may be optimized in the spectral range between 1400 nm to 2000 nm, the fibers in the fifth column may be optimized in the spectral range between 1900 nm and 2500 nm. Note that, the same spectral coverage, e.g., 200 nm to 2500 nm, may be equally achievable using any other number of optical fibers, which may be for example, 2, 3, 4, or 6.

In such a customized fiber arrangement, a broad spectral coverage, e.g., 200 nm to 2500 nm, can be obtained by sequentially switching between fibers in different columns and the overall fiber lifetime can be extended by sequentially switching between fibers in different rows. In this case, fiber core switching may be initiated by a command sent either by a metrology tool or an operator and enabled by a control system of the broadband radiation source RDS1 which controls for example the movement of the fiber assembly FAA. This arrangement may be preferred for applications where multiple different spectral bands are desired but not simultaneously required. Since this customized arrangement may allow each fiber to be optimized for a particular spectral range/band, the output radiation from each fiber may be non-overlapping with the fiber resonance bands that are determined by the fiber structure, e.g., core-wall thickness and/or core cross-sectional width (e.g., diameter). Less or no radiation-glass (e.g., cladding structure) overlapping means less heating inside the cladding structure and thus longer lifetime of the fiber.

Figure 13:
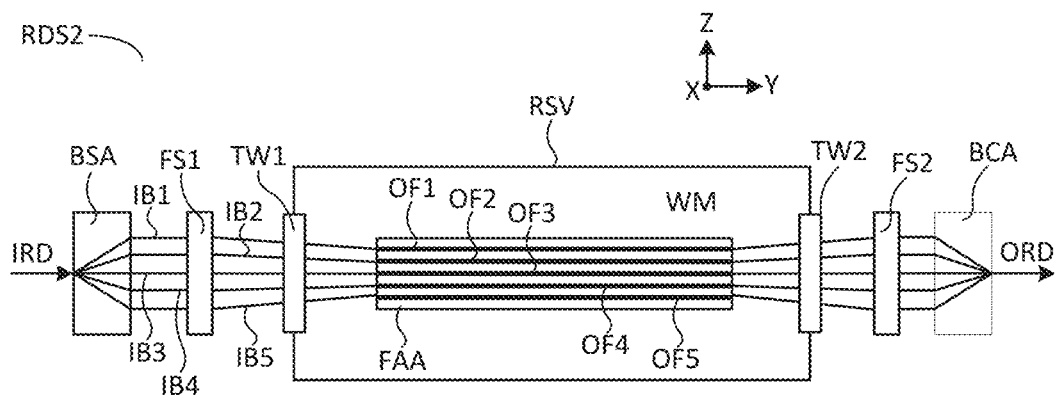
FIG. 13 schematically illustrates a broadband radiation source comprising a fiber assembly in accordance with an embodiment and a multi-beam configuration.

In cases where a broad spectral coverage, e.g., 200 nm to 2500 nm, is desired to be provided simultaneously rather than sequentially from the fiber assembly FAA, the input radiation IRD may be spatially split into multiple separate beams, each of which is subsequently focused into a different fiber within a row. The multiple beams of output radiation ORD with multiple different spectral bands may then be spatially and temporally recombined into a single broadband output beam. FIG. 13 schematically illustrates a multi-beam configuration of a broadband radiation source comprising a fiber assembly FAA in accordance with an embodiment. The fiber assembly FAA may be simultaneously pumped by multiple beams of input radiation IRD. The fiber assembly FAA may be for example any one of the above described fiber assemblies FAA1-FAA4.

Where the fiber assembly comprises a 2D fiber assembly (e.g., assembly FAA1 of FIG. 10(a)) in a radiation source such as source RDS2 of FIG. 13, a 1D array of multiple (e.g., five) input beams IB1-IB5 may be generated by passing the input radiation IRD through a beam splitting arrangement BSA. The beam splitting arrangement BSA may comprise for example an array of individual beam splitters, e.g., parallel glass plates. Each of the beam splitters may have suitable optical coatings optimized for a desired splitting ratio for the spectral band of the input radiation IRD. The five input beams IB1-IB5 may have substantially the same optical characteristics and may be respectively focused into the five hollow cores HC of a certain row (e.g., OF1-OF5 in the top row) of the fiber assembly FAA1 by means of a first focusing arrangement FS1. The first focusing arrangement FS1 may be placed in-between the beam splitting arrangement BSA and the first transparent window TW1. At the output end, a second focusing arrangement FS2 may be used to collimate the five beams of output radiation ORD and a beam combining arrangement BCA may be used to spatially recombine the five beams of output radiation ORD into a single output beam. The beam combining arrangement BCA may comprise for example five reflective mirrors arranged to direct each of the beams of output radiation ORD to the same output beam path. Each of the reflective mirrors may have a highly reflective coating optimized for the spectral band of an output beam being directed by the mirror. Additionally or optionally, an optical delay arrangement may be placed in-between the second focusing arrangement FS2 and the beam combining arrangement BCA to compensate or customize the optical delay between different beams of output radiation.

In some embodiments, the focusing arrangements FS1, FS2 may comprise a 1D or 2D array of individual optical lenses. In different embodiments, the focusing arrangements FS1, FS2 may comprise a 1D or 2D micro-lens array comprising an array of micro-lenses fabricated in a single optical substrate. In other different embodiments, the focusing arrangements FS1, FS2 may comprise a spatial light modulator, such as digital micro-mirror device (DMD) comprising a 1D or 2D array of individually controllable micro-mirrors. Each of the micro-mirrors may comprise a suitable radius of curvature configured to focus one of the input beams into one of the hollow cores. Using a spatial light modulator e.g., DMD, as a focusing arrangement FS1, FS2, the radiation source RDS2 of FIG. 13 may not only allow for sequential pumping of multiple hollow cores HC of the fiber assembly FAA with a single beam of input radiation IRD, but also allow for simultaneous pumping of multiple hollow cores HC of the fiber assembly FAA with an array of multiple input beams. When the radiation source RDS2 is used in any of the aforementioned metrology tools, multiple illumination beams with different spectral bands and numerical apertures could be achieved in order to provide simultaneous illumination in different parts of a sample and/or in different spectral bands.

Figure 14:
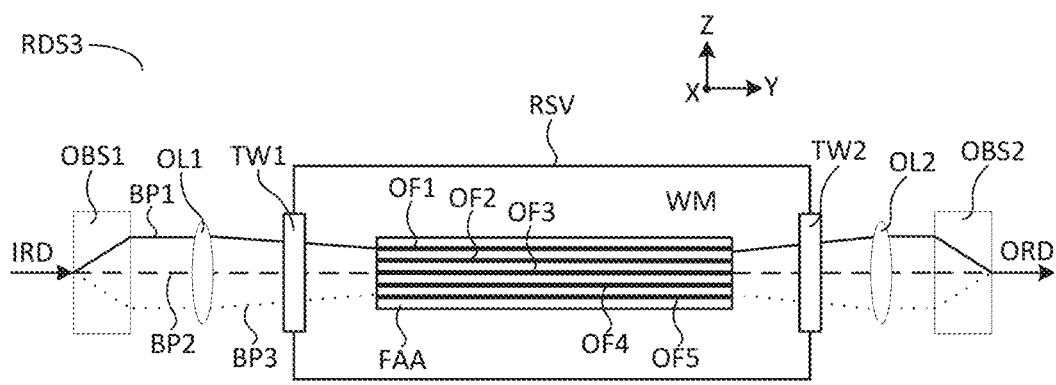
FIG. 14 schematically illustrates a broadband radiation source comprising a fiber assembly in accordance with an embodiment and a single beam configuration.

As described above, fiber core switching may be achievable by translating the fiber assembly FAA with respect to the beam of input radiation IRD, and/or shifting the beam of input radiation IRD with respect to the fiber assembly FAA. FIG. 14 schematically illustrates a radiation source RDS3 arrangement comprising a fiber assembly FAA in accordance with an embodiment and a second single input beam configuration. Different to the first configuration shown in FIG. 12, in this second configuration, the beam of input radiation IRD may be shifted with respect to the fiber assembly FAA. Spatial shifting of the input beam may be achievable by means of a first optical beam shifter OBS1. In some embodiments, the first optical beam shifter OBS1 may comprise for example at least one plane-plane parallel glass plate. A plane-plane parallel glass plate may have an optical input surface and an optical output surface, which are both substantially flat and are substantially parallel to each other. Plane-plane parallel glass plates may only displace an optical beam without causing pointing changes to the beam of input radiation IRD. The amount of beam displacement may be dependent on an input angle formed between the input beam and the optical input surface. When a plane-plane parallel glass plate is arranged such that the optical input surface (and optical output surface) is perpendicular to the input optical beam of input radiation IRD, i.e. the input angle being 90°, it may cause no or negligible beam displacement to the input beam. Whereas, when the input angle moves away from 90° as a result of the glass plate being rotated with respect to the input beam, e.g., about the X-axis in FIG. 14, spatial displacement of the input beam may be generated, e.g., in the Y-Z plane. The amount of spatial displacement may be proportional to the angle difference between a new angular position and the non-displacement angular position, i.e. the input angle being 90°. The input and out surfaces of a plane-plane parallel glass plate may have coatings that are anti-reflective in the spectral range of the input radiation IRD.

In the case of a 1D fiber assembly, e.g., the fiber assembly FAA3 of FIG. 11(a), being used in the radiation source RDS3 of FIG. 14, a 1D beam shifting element such as a single parallel glass plate may be used to shift the beam of input radiation IRD vertically or in the plane defined by the Y and Z directions. By varying the rotation angle of the parallel glass plate, the beam path of input radiation IRD may be shifted, for example from a first beam path BP1 to a second beam path BP2 and subsequently to a third beam path BP3. The parallel glass plate may be mounted on a rotatory actuator capable of providing high precision rotational movement. The angular positions of the parallel glass plate may be predetermined based on the spatial separation between two neighboring fiber cores of the fiber assembly FAA3 and the magnification of a first optical lens OL1. Whenever a current optical fiber OF is due for replacement, the input radiation IRD may be at least partially blocked by means of e.g., a beam block. The rotatory actuator may rotate the parallel glass plate so as to ensure the beam of input radiation IRD propagating along a new beam path is substantially aligned with the hollow core HC of a new optical fiber OF. For example, when the beam path of the input radiation IRD changes from the first beam path BP1 to the second beam path BP2, a new optical fiber OF3 is then used to generate broadband output radiation ORD rather than the previous optical fiber OF1.

Once the beam of input radiation IRD is in the target beam path, the attenuated or full input radiation IRD may be allowed to enter the hollow core HC of the new fiber. Subsequently, the radiation source RDS3 may enter an input coupling optimization mode in which the coupling between the input radiation IRD and the hollow core HC of the new fiber is optimized. The input coupling optimization may be evaluated by monitoring certain optical characteristics of the output radiation, e.g., spectrum and/or power while adjusting one or more components of the radiation source RDS3. In some embodiments, the input coupling optimization may involve for example fine scanning of the position of the input beam with respect to the fiber core in the X, Y and Z directions. Additionally or optionally, the optimization routine may also involve tilting (e.g., tilting about the X direction Rx, tilting about Z direction Rz) of the first optical lens OL1 in order to adjust or optimize the pointing the input beam and/or translating of the first optical lens OL1 (e.g., along the Y direction) in order to adjust or optimize the focus position of the input beam into the fiber core. Similar to the embodiment of FIG. 12, the input coupling optimization may be carried out only once when a new fiber assembly FAA is installed. After the initial input coupling optimization, subsequent fiber core switching may be done repeatably without a need for further optimization. However, the input coupling optimization may be re-activated anytime where it is needed (e.g., for fault-finding purposes).

As shown in FIG. 14, the radiation source RDS3 may comprise a second optical beam shifter OBS2 which may also comprise at least one plane-plane parallel glass plate mounted on a rotatory actuator. The plane-plane parallel glass plate may have a coating that is anti-reflective in the spectral range of the output radiation ORD. The rotatory actuator of the first optical beam shifter OBS1 and the rotatory actuator of the second optical beam shifter OBS2 may move in combination to corresponding respective new angular positions which aims to bring the beam of the output radiation back to the default or desired beam path based on the way downstream optics (e.g., optics in a metrology tool) may be aligned. The default or desired beam path may be determined by for example optical alignment in a metrology tool in case of the output radiation being used in the tool and/or a position of an output delivery fiber in case of the output radiation being coupled into the output delivery fiber. When the input coupling optimization is complete, the radiation source RDS3 may enter an output coupling mode in which the position of the output beam may be optimized. In some embodiments, the output coupling optimization may comprise for example fine adjustment of the second optical beam shifter OBS2, e.g., by tilting and/or translating the second optical lens OL2.

The plane-plane parallel plate may be comprised of a low dispersion material, for example N-FK58 of $CaF_2$. An advantage of such a material is it can reduce spectral variation of the beam shift d, as the lower dispersion means that the refractive index varies less with wavelength. The relation is given by:

$$d = T \cdot \sin\theta \left(1 - \frac{\cos\theta}{\sqrt{n^2 - (\sin\theta)^2}}\right)$$

where T is the thickness of the plane-plane parallel plate and θ is the angle of incidence with respect to the plane-plane parallel plate normal. The low dispersion may be advantageous in particular at the output side, due to the wider spectral range.

In different embodiments, either or both of the first optical beam shifter OBS1 and the second optical beam shifter OBS2 may comprise one or more galvo-scanners or piezo-mirrors where the sagittal and tangential plane of the reflecting mirror is controlled with sub-micrometer resolution. By using two or more such mirrors in sequence may allow for a complete alignment of the radiation beam to the specific hollow-fiber in the fiber assembly.

With continued reference to FIG. 14, in the case of a 2D fiber assembly, e.g., fiber assembly FAA1 of FIG. 10(a), being used in the radiation source RDS3, the first optical beam shift OBS1 may comprise two plane-plane glass plates, e.g., a first plate and a second plate. The first plate may be rotatable about a first axis and the second plate may be rotatable about a second axis, wherein the first axis and the second axis may be perpendicular to each other and form a plane parallel to an input facet of the fiber assembly FAA. In a particular embodiment, the input facet of the fiber assembly FAA may be perpendicular to the beam of input radiation IRD. For example, with continued reference to FIG. 4, the first glass plate may be arranged to rotate horizontally or about the Z-axis; and the second glass plate may be arranged to rotate vertically or about the X-axis. The first glass plate may be placed either downstream or upstream of the second glass plate. The downstream glass plate may be sufficiently large in the direction along which the input beam is shifted by the upstream glass plate. As such, the downstream glass plate will be able to catch the displaced input beam no matter how large the angle the upstream glass plate is rotated.

In other embodiments, the fiber assembly FAA (e.g., FAA1, FAA2, FAA3 or FAA4) may allow each individual fiber core to be selectively pressurized with different gas medium or vacuum. Selective pressurization of each individual fiber core may be achieved for example by creating one or more gas channels in the support portion of each fiber which connects the fiber core to a different gas supply. Alternatively, such embodiments may comprise the use of HC-PCFs which are not comprised within a gas cell, but have a gas medium enclosed (e.g., sealed) individually within the HC-PCFs. Such a configuration may provide additional flexibility in controlling the optical characteristics of the output radiation ORD.

Figure 15:
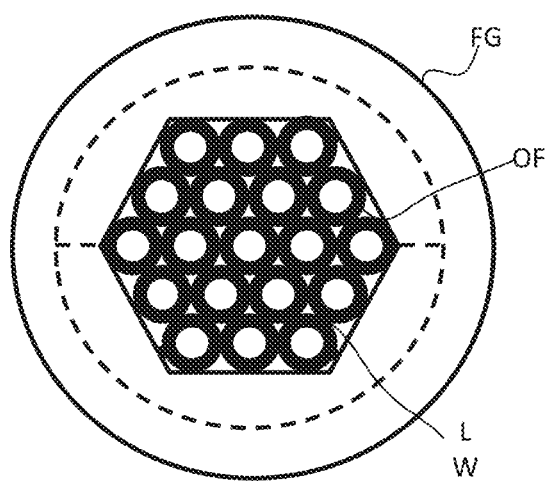
FIG. 15 schematically illustrates a multiple fiber stacking arrangement according to an embodiment.

FIG. 15 illustrates an embodiment of the fiber assembly which comprises a multiple fiber stacking arrangement. FIG. 15 shows, in cross section, a number of optical fibers OF within a fiber guide FG. In contrast to configurations where multiple optical fibers OF are individually assembled in a 1D or 2D grooved mount (such as the examples shown in FIGS. 11(a) and 11(b)), fiber stacking based configurations allow more fibers to be placed within a given volume. This has two advantages: longer lifetime of the gas cell through increased redundancy and a smaller pitch which decreases optical beam adjustment range and speed. In the embodiment of FIG. 15, the fiber clamping may be achieved by mechanical clamping e.g., by two or more mechanical members forming the fiber guide FG. Alternatively or additionally, the fiber clamping may be achieved by gluing, fusing or (laser) welding LW the fiber ends to each other.

For many applications e.g., those desiring a clean operating environment or involving UV radiation, it may not be favorable to use a multiple fiber stacking arrangement where the optical fibers are clamped or fixed by glue. This is due to the fact that glue tends to outgas which leads to contamination, and glue is likely to degrade under UV exposure which causes fiber drift. Moreover, glue can also cause unwanted and changing stress in optical fibers, thereby resulting in changing performance over lifetime or changing operational conditions. Although successfully circumventing the outgassing contamination and UV induced degradation problems, clamping a stack of optical fibers using fusing or welding is very time consuming, in particular when the multiple fiber stacking arrangement comprises a large quantity of optical fibers.

Mechanical clamping is able to avoid contamination and UV induced degradation issues and at the same time, can be implemented in a fast manner. Robust and stable mechanical clamping of a stack of optical fibers may be obtained using a multiple fiber stacking arrangement or configuration which fulfils one or more (e.g., all) of the following three criteria. A first such criterion is that each optical fiber in a multiple fiber stacking arrangement has a defined clamping, which means each optical fiber has two supports (or contact points). If an optical fiber has more than two supports in the multiple fiber stacking arrangement, the clamping of such an optical fiber is over-defined. In the cases where an optical fiber has more than two supports or its clamping is over-defined, the force vector on at least one of the supports of the optical fiber becomes uncertain and is dependent on tolerances of the optical fibers and the fiber holder. By contrast, if an optical fiber has fewer than two supports, then the clamping of the optical fiber is under-defined. In such a case where an optical fiber has fewer than two supports or its clamping is under-defined, such an optical fiber is not properly clamped.

A second criterion is that the resulting or combined force vector to which each optical fiber is subject intersects a line formed between the two supports (or contact points) of the optical fiber.

A third criterion is that the clamping force does not exceed a maximum force allowable by each optical fiber (e.g., a top optical fiber on which the clamping force is directly applied). Such a maximum force is determined by fiber robustness for stress and mode-matching. In other words, the maximum force may be such that when applied to an optical fiber, the properties of the optical fiber and the optical characteristics of radiation emitted from the optical fiber are substantially unchanged. The clamping force may also be sufficiently strong such that each optical fiber is subject to a force sufficient for firmly clamping those fibers located at the bottom of a fiber stack.

Figures 16A, 16B:
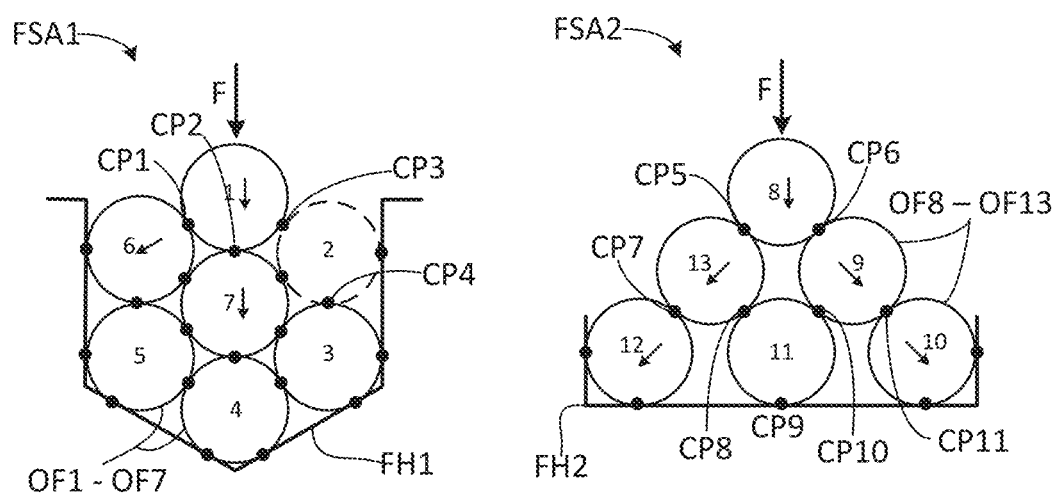
FIG. 16(a) depicts an example fiber stacking arrangement for mechanically clamping optical fibers.
FIG. 16(b) depicts a further example fiber stacking arrangement for mechanically clamping optical fibers.

Existing methods for mechanically clamping a stack of optical fibers do not fulfill the aforementioned criteria and hence often result in unstable fiber clamping. When such unstably clamped fiber stack is used in any of the above embodiments, e.g., embodiments shown in FIGS. 12 to 14, it would give rise to sub-optimal coupling of the input radiation thereby resulting in the fiber being damaged or the performance of the output radiation being degraded. FIGS. 16(a) and 16(b) schematically depict two example fiber stacking arrangements that are mechanically clamped. In both example fiber stacking arrangements FSA1, FSA2, mechanical clamping is achieved by using a fiber holder in combination with a fiber clamp, which when combined together form a hollow fiber channel. The two example arrangements comprise different fiber holders (and thus different fiber clamps) and support different numbers of optical fibers. For the purposes of describing the working principles and the associated problems, both example arrangements are simplified to only show the fiber holder. The fiber clamp is represented by a clamping force F.

With reference to FIG. 16(a), fiber holder 1 FH1 of the fiber stacking arrangement FSA1 holds seven optical fibers OF1-OF7. A clamping force F is applied directly onto the optical fiber 1 OF1. The clamping force F is then transferred from the top fiber (e.g., optical fiber 1 OF1) to the bottom fibers (e.g., optical fiber 4 OF4) via various contact points or supports (as indicated by solid dots) which are either formed between adjacent optical fibers OF1-OF7 or between optical fibers and the internal wall of fiber holder 1 FH1. For example, the clamping force F transfers through optical fiber 1 OF1 to optical fiber 6 OF6, optical fiber 7 OF7 and optical fiber 2 OF2 via contact point 1 CP1, contact point 2 CP2, and contact point 3 CP3, respectively. Since optical fiber 1 OF1 has three supports or contact points CP1 to CP3, its clamping is over-defined and thus unstable. This is because the force vectors on those three contact points are highly dependent on, and therefore sensitive to, the manufacturing tolerances of the three contacting optical fibers OF2, OF6, OF7. For example, for a HC-PCF with a nominal diameter of 100 μm to 300 μm (after removing external coating), the typical manufacturing tolerance of the fiber diameter is about ±3 μm. The manufacturing tolerance of the fiber holder FH1 is typically in the range of ±5 μm to ±10 μm (depending on cost).

If for example optical fiber 2 OF2 is undersized (e.g., having a fiber diameter smaller than a nominal diameter), optical fiber 1 OF1 is predominantly or fully supported by optical fiber 6 OF6 and optical fiber 7 OF7 via contact point 1 CP1 and contact point 2 CP2, respectively. In such a case, optical fiber 2 OF2 barely touches or even completely detaches from optical fiber 1 OF1. As such, the force vector on contacting point 3 CP3 is negligible or zero. Since no or negligible clamping force is transferred to optical fiber 2 OF2 via contact point 3 CP3, optical fiber 2 OF2 thus loosely sits on top of optical fiber 3 OF3 via contact point 4 CP4. Optical fiber 2 OF2 may wobble between the contact point with optical fiber 7 OF7 and the contact point with the internal wall of fiber holder 1 FH1. The clamping of optical fiber 2 OF2 is therefore under-defined and loose. Likewise, if optical fiber 6 OF6 or optical fiber 7 OF7 is undersized, the corresponding contact point with optical fiber 1 OF1 (e.g., contact point 1 CP1, contact point 2 CP2) would have a negligible or zero force vector and the optical fiber would be loosely clamped. Similar loose or unstable clamping can also result from some of the optical fibers being over-sized. Since the clamping of the optical fibers OF1-OF7 in the fiber stacking arrangement FSA1 is either over-defined or under-defined, high requirements on the manufacturing tolerances of the optical fibers and the fiber holder are necessary in order to ensure a stable and robust fiber clamping.

FIG. 16(b) schematically illustrates a fiber stacking arrangement FSA2. In this example arrangement, fiber holder 2 FH2 supports a stack of six optical fibers OF8-OF13. All the optical fibers other than optical fiber 11 OF11 are supported by two contact points. Optical fiber 11 OF11 is supported by only one contact point, i.e. contact point 9 CP9. To mechanically clamp this fiber stack, a clamping force F is applied directly onto the top optical fiber, i.e., optical fiber 8 OF8. Since optical fiber 8 OF8 is supported by contact point 5 CP5 and contact point 6 CP6, the force vector on each of these two contact points is one half of the force vector to which optical fiber 1 OF1 is subject. Optical fiber 1 OF1 is supported stably. Even though both optical fiber 13 OF13 and optical fiber 9 OF9 are supported by two contact points, their force vectors only point to single contact points, e.g., contact point 7 CP7 and contact point 11 CP11, respectively. More specifically, in the case of optical fiber 13 OF13, its force vector which is transferred from optical fiber 8 OF8 only points to contact point 7 CP7, resulting in contact point 8 CP8 being undefined (or having a negligible or zero force vector). Likewise, the force vector of optical fiber 9 OF9 points only to contact point 11 CP11, resulting in contact point 10 CP10 being undefined (or having a negligible force vector). Consequently, optical fiber 11 OF11 sees no clamping force and hence is not properly clamped. The clamping stability is worsened when optical fiber 11 OF11 is undersized (e.g., having a fiber diameter less than a nominal diameter) as it can then wobble between optical fiber 13 OF13 and optical fiber 9 OF9. Uncertainty in fiber position would cause potential fiber damage when such fiber stacking arrangement is used in any of the above embodiments, e.g., embodiments shown in FIGS. 12 to 14.

Figure 17A:
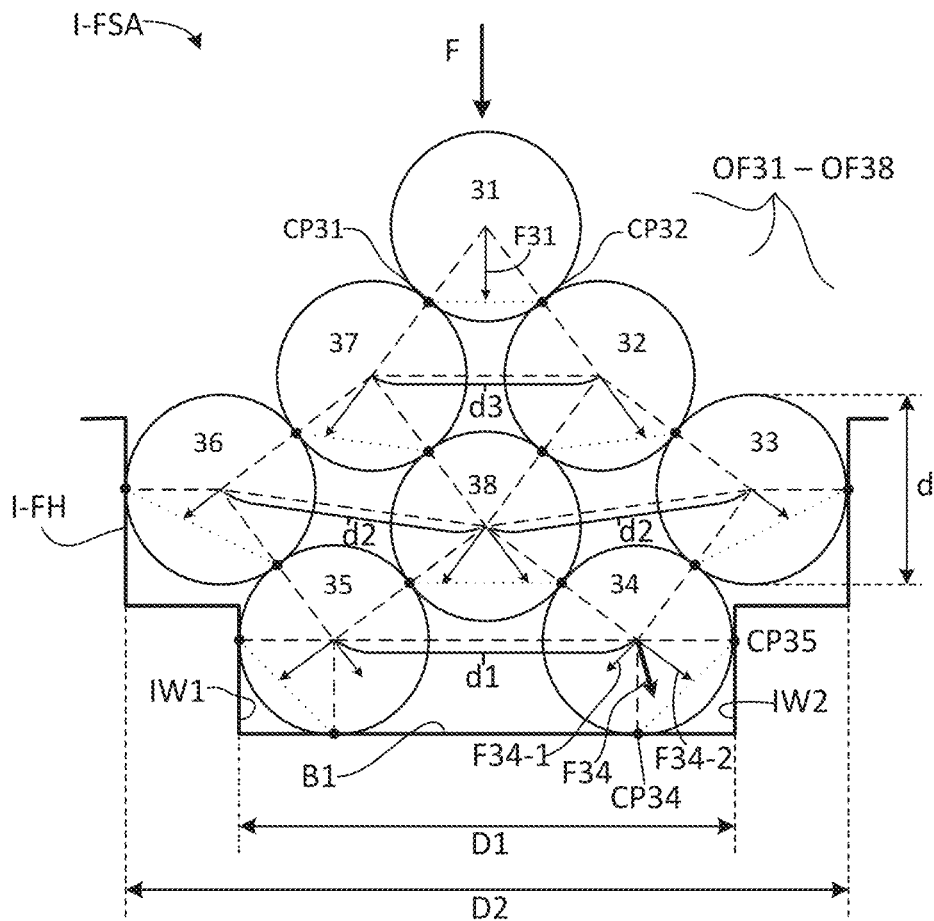
FIG. 17(a) depicts an improved fiber stacking arrangement in accordance with an embodiment.

In an embodiment, in order to, e.g., simultaneously fulfill the three criteria mentioned above, a multiple fiber stacking arrangement may be configured such that the center distance between any two adjacent optical fibers reduces in a bottom-up manner (i.e., for each row from bottom to top). FIG. 17(a) schematically illustrates an improved fiber stacking arrangement in accordance with an embodiment. The improved fiber stacking arrangement I-FSA may comprise a fiber holder I-FH and a fiber clamp (not shown). For the sake of simplicity, the effect of the fiber clamp is represented by a clamping force F. Note that the Figure is a cross-section view of the fiber stacking arrangement. In some embodiments, fiber holder I-FH and fiber clamp may extend along the axial axis of the optical fibers OF31-OF38 and cover the full length of the fibers. In different embodiments, it may be that the fiber holder I-FH and fiber clamp does not cover the full length of the fiber and is instead be applied only at each of both end sections of the fibers. In other different embodiments, it may be that the fiber holder I-FH and fiber clamp is applied only at one end section, e.g., on the input end section of the fibers into which the input radiation IRD is coupled. For example, in such an embodiment, the length of the fiber holder I-FH and fiber clamp may have a maximum length of between 10 mm and 50 mm and/or a minimum length between 2 mm and 5 mm; for example, this length may be in the range between 5 mm and 50 mm, or between 5 mm and 20 mm, or between 5 mm and 10 mm.

To avoid stress concentration due to an edge effect, clamping the very end(s) of the fibers (fiber tips) may be avoided, and the fiber holder I-FH and fiber clamp are applied a small distance away from the fiber tips. This distance may be such that a fiber tip section between 0.1 mm and 5 mm, between 0.2 mm and 5 mm, between 0.5 mm and 5 mm, between 0.5 mm and 2 mm, or between 0.5 mm and 2 mm is not clamped. As such, where clamping is described as being applied at an end section, it should be appreciated that in this context, such an "end section" may exclude a fiber tip section at the very end (i.e., the or each end section does not extend all the way to the fiber tip). Similarly, clamping which covers the full length of the fibers may also be understood as not covering these fiber tip sections at either end.

In this embodiment, the fiber holder may comprise a multi-level (e.g., two-level) structure wherein the width of an upper (or second) level is wider than that of a lower (or first) level, e.g., D2>D1. In this context, the width may be defined as the distance between two facing internal walls on the same level, e.g., the width of D1 is the distance between IW1 and IW2 on the first level. At each level, the internal walls (e.g., internal wall 1 IW1, internal wall 2 IW2) may be substantially perpendicular to the base (e.g., B1). Such a fiber holder may also be regarded as comprising multi-level (e.g., two level) rectangular grooves. The resulting fiber stack may comprise four stacking levels, with optical fibers OF34, OF35 being on the first stacking level (or the bottom level), optical fibers OF33, OF38, OF36 being on the second stacking level, optical fibers OF37, OF32 being on the third stacking level and optical fiber OF31 being on the fourth stacking level (or the top level). The width D1 of the first level of the improved fiber holder I-FH may be larger than a nominal fiber cross-sectional width (e.g., diameter) d by a first scale factor of e.g., 2.7; while the width of the second level of the improved fiber holder I-FH may be larger than the nominal fiber cross-sectional width d by a second scale factor of between 3.5 and 3.9, between 3.6 and 3.8, between 3.65 and 3.75, between 3.69 and 3.71 or e.g., 3.7. Such relationships between the dimensions of the fiber holder I-FH and the fiber nominal cross-sectional width may help ensure that the center distance between two adjacent optical fibers on the same level reduces in a bottom-up manner. For example, the center distance d1 between optical fiber 34 OF34 and optical fiber 35 OF35 may be larger than the center distance d2 between optical fiber 36 OF36 and optical fiber 38 OF38 or between optical fiber 38 OF38 and optical fiber 33 OF33, which in turn may be larger than the center distance d3 between optical fiber 37 OF37 and optical fiber 32 OF32. In the embodiment of FIG. 17(a), the center distance d1 between optical fiber 34 OF34 and optical fiber 35 OF35 may be larger than the nominal fiber cross-sectional width d by a third scale factor of e.g., 1.7.

In an embodiment, each of the optical fibers OF31-OF38 may be supported by two contact points and the resulting or combined force vector of each optical fiber may intersect a line formed in-between its two contact points. For example, each of the optical fibers OF31, OF32, OF33, OF36, OF37 may be subject to a single force vector transferred from an upper optical fiber (e.g., optical fiber 36 OF36 may be subject to a force vector transferred from optical fiber 37 OF37). In these cases, the single force vector (e.g., F31) of each optical fiber (e.g., OF31) intersects directly the dashed line formed in-between the two contact points (e.g., CP31 and CP32) of the same fiber (e.g., OF31).

By contrast, each of the optical fibers OF34, OF35, OF38 may be contacted with two upper optical fibers and therefore may be subject to two force vectors, each following a different direction. For each of these three optical fibers OF34, OF35, OF38, a resulting or combined force vector may be determined. By way of an example, optical fiber OF34 may be contacted with two upper optical fibers OF33, OF38. Consequently, optical fiber OF34 may be subject to a first force vector F34-1 transferred from optical fiber 33 OF33 and a second force vector F34-2 transferred from optical fiber 38 OF38. The resulting or combined force vector F34 (as indicated by the thick arrow in FIG. 17(a)), that is applied to optical fiber 34 OF34, may intersect the dashed line formed in-between the two contact points, CP34, CP35. In a similar manner, the resulting or combined force vector of each of the optical fiber 35 OF35 and optical fiber 38 OF38 may also intersect the dashed line formed in-between its two contact points.

The embodiment of FIG. 17(a) thus simultaneously fulfills the first two of the aforementioned criteria: each optical fiber is supported by two defined supports or contact points and the resulting force vector of each optical fiber intersects a line formed in-between its two supports. The fiber stacking arrangement configured in such a manner is less sensitive to manufacturing tolerances of the optical fibers and the fiber holder and thus is able to significantly improve the stability of the mechanical clamping. Since the clamping force reduces in a top-down manner, the clamping force F may be sufficiently strong such that the bottom optical fibers OF34, OF35 can be subject to sufficiently strong force vectors and can therefore be firmly clamped in position. In the meantime, the clamping force F may maintained not to exceed the maximum allowable force of each optical fiber, in particular the top optical fiber OF31 on which the clamping force is directly applied. This is to help ensure that a stable and robust mechanical clamping of a fiber stack is achieved without degradation of optical performance due to the application of the clamping force. A clamping force may induce stress in the fibers which can lead to for example polarization angle shift and mode matching degradation, thereby causing significant performance loss. The allowable level of the induced stress may be dependent on the cladding thickness of the fibers. The maximum clamping force may be in the range between 10 and 50 Newtons (N), for example 10 N, 20 N, 30 N, or 40 N.

Note that the foregoing embodiment is only an example. Other different embodiments which simultaneously fulfill the aforementioned three criteria are equally applicable. For example, in some embodiments, the improved fiber holder I-FH may comprise fewer or more than two levels (e.g., 1, 3, 4, 5, or 6 levels) and can thus clamp fewer or more than eight optical fibers (e.g., 3, 15, 24, 35, or 48 optical fibers) in a stable and robust manner.

Figure 17B:
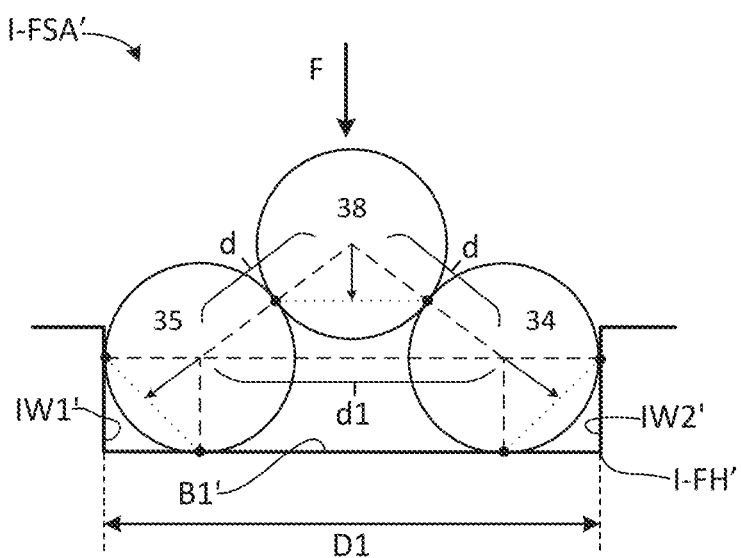
FIG. 17(b) depicts a further improved fiber stacking arrangement in accordance with an embodiment.

FIG. 17(b) schematically illustrates a different improved fiber stacking arrangement in accordance with an embodiment. In this fiber stacking arrangement I-FSA', the fiber holder I-FH' may comprise a single level. The distance D1 between two facing internal walls IW1', IW2', which are substantially perpendicular to the base B1', may be larger than a nominal fiber cross-sectional width (e.g., diameter) d by a first scale factor of between 2.5 and 2.9, between 2.6 and 2.8, between 2.65 and 2.75, between 2.69 and 2.71 or e.g., 2.7. Accordingly, the center distance d1 between optical fiber 34 OF34 and optical fiber 35 OF35 may be larger than the nominal fiber cross-sectional width d by a third scale factor of between 1.5 and 1.9, between 1.6 and 1.8, between 1.65 and 1.75, between 1.69 and 1.71 or e.g., 1.7. Similar to the embodiment of FIG. 17(a), each of the three optical fibers OF34, OF35, OF38 is stably supported by two contact points and is subject to a force vector that directly intersects the line formed in-between its two contact points. Hence, such a fiber stacking arrangement I-FSA' also allows for a stable and robust clamping of a fiber stack.

Note that the total number of optical fibers which can be mechanically clamped in a fiber stacking arrangement may scale with the number of the levels of the fiber holder I-FH. However, the total number may not be further increased when any two adjacent optical fibers on the same level are in contact with each other. In such a case, the center distance between these two adjacent fibers is minimum and is equal to the fiber cross-sectional width d.

In an embodiment, the support angle defined between any two adjacent contact points of a fiber (with respect to the fiber center) lies within a range between 60° and 120°. Considering the example of FIG. 17(b), the first row support angle is 120°, the second row support angle is 90°, and the third row support angle is 60°. With the number of rows totaling 4 the minimum angle of force vector to support is 30°.

Other stacking configurations to those described above may be used, e.g., there may be more than two optical fibers on the bottom level of the fiber stack. In such configurations, the widths of the different levels of the fiber holder I-FH may have different relationships (e.g., different scale factors) with the fiber cross-sectional width such that the center distance between any two adjacent optical fibers reduces in a bottom-up manner. In different embodiments, it may be preferable to remove external coating of each optical fiber before stacking and clamping them together.

Typically, the fiber holder I-FH, I-FH' may be made of a material (e.g., glass, metal) different to that of optical fibers and may thus have a different coefficient of thermal expansion. The mismatch in coefficient of thermal expansion between the fiber holder and the optical fibers can cause relative movement during temperature variations. By way of an example, a fiber holder made of stainless steel may be used to mechanically clamp a number of optical fibers made of fused silica. Since the coefficient of thermal expansion of stainless steel is much higher than that of fused silica, when the ambient temperature rises, the fiber holder undergoes a higher degree of thermal expansion than the optical fibers, resulting in the optical fibers being loosely clamped (the fiber holder becomes too large to tightly clamp the optical fibers). When the elevated ambient temperature drops back to the original temperature at which the optical fibers were tightly clamped in the fiber holder, the fiber holder and optical fibers shrink back to their original sizes. However, the friction between any two contacting surfaces, e.g., between any two optical fibers, or between an optical fiber and internal wall/base of the fiber holder, can prevent some or all of the optical fibers from returning to their aligned positions with respect to the fiber holder and consequently prevent the original state of tight mechanical clamping from being self-restored or substantially self-restored (e.g., the fiber clamping is either over-defined or under-defined). To be able to withstand the impact of temperature cycles/variations, more stringent design criteria may be implemented in addition to the above described design requirements. In some embodiments, the additional design criteria may comprise for example a criterion on the support angle of each optical fiber, a criterion on every force vector angle and a criterion on coefficient of friction of any two contacting surfaces.

Figure 17C:
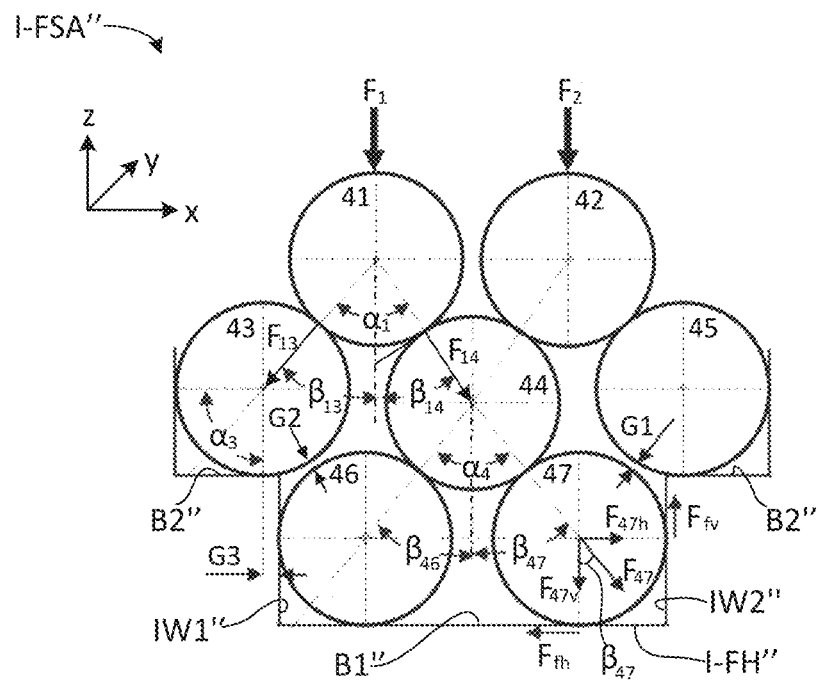
FIG. 17(c) depicts a further improved fiber stacking arrangement in accordance with an embodiment.

FIG. 17(c) schematically depicts a further improved fiber stacking arrangement in accordance with an embodiment. In this embodiment, the further improved fiber stacking arrangement I-FSA" may tightly clamp seven optical fibers OF41-OF47. In order to robustly and stably clamp the optical fibers OF41-OF47, two fiber clamps applying substantially the same magnitude of clamping force may be required. This is in contrast to the embodiment shown in FIG. 17(a) or 17(b) where a single fiber clamp or a single clamping force F is used. Again, for the sake of simplicity, the effect of each fiber clamp is represented by a clamping force $F_1$, $F_2$ (e.g., $F_1=F_2$). The fiber holder I-FH" may be of the same structure as the fiber holder I-FH shown in FIG. 17(a), e.g., a two-level rectangular groove. The dimensions (e.g., the distance between two facing internal walls IW1", IW2" at each level of the fiber holder I-FH") of the fiber holder I-FH" may be different due to the implementation of more stringent design criteria.

As shown in FIG. 17(c), each optical fiber OF41-OF47 may be supported by two contact points. For each optical fiber OF41-OF47, a support angle may be formed by two lines that respectively connect the center of the optical fiber and the two contact points. For example, optical fiber OF41, optical fiber OF43, and optical fiber OF44 respectively have a support angle $\alpha_1$, support angle $\alpha_3$, and support angle $\alpha_4$. In cases of an optical fiber being supported by another two optical fibers, the support angle is equal to the sum of two force vector angles, each being formed between the direction of a corresponding force vector and the vertical direction or z-direction with reference to the local coordinate system shown in FIG. 17(c). For example, in case of optical fiber OF41, force vector angle $\beta_{13}$ is formed between the direction of force vector $F_{13}$ applied to optical fiber OF43 by optical fiber OF41 and the vertical direction; and force vector angle $\beta_{14}$ is formed between the direction of force vector $F_{14}$ applied to optical fiber OF44 by optical fiber OF41 and the vertical direction. The two force vector angles $\beta_{13}$ and $\beta_{14}$ may have the same or different values depending on the relative positions (e.g., relative center positions along the z-direction) of optical fiber OF43 and optical fiber OF44. In case of optical fiber OF44, although it has four contact points formed respectively with optical fiber OF41, optical fiber OF42, optical fiber OF46 and optical fiber OF47, optical fiber OF44 is still supported by two contact points (with optical fiber OF46 and optical fiber OF47) and thus its support is well defined. In a similar manner as optical fiber OF41, support angle $\alpha_4$ is equal to the sum of force vector angle $\beta_{46}$ and force vector angle $\beta_{47}$.

As mentioned above, there exists a frictional force at each contact point which can prevent optical fibers from returning to their original positions. Therefore, to overcome such a frictional force, the tangential component of the resulting force vector of any optical fiber may be greater than the frictional force in the tangential direction; and the normal component of the resulting force vector of the same optical fiber may be greater than the frictional force in the normal direction (if applicable). Note that, the resulting force vector of an optical fiber is the total force vector that combines all the force vectors applied on the optical fiber.

By way of an example, optical fiber OF47 may have a resulting force vector $F_{47}$ applied solely by optical fiber OF44. The resulting force vector $F_{47}$ may be decomposed into a tangential component $F_{47h}$ and a normal component $F_{47v}$. Optical fiber OF47 is supported by two contact points, one formed with the internal wall IW2" and the other formed with the base B1". At the contact point on the surface of the internal wall IW2", there exists a frictional force $F_{fv}$, the magnitude of which depends on the magnitude of the tangential component $F_{47h}$ of the resulting force vector $F_{47}$ and the coefficient of friction at the contact point. At the contact point formed by the optical fiber OF47 and the base B1", there exists a frictional force $F_{fh}$, the magnitude of which depends on the magnitude of the normal component $F_{47v}$ of the resulting force vector $F_{47}$ and the coefficient of friction at the contact point. The coefficient of friction at any contact point is dependent on the material of the contacting surfaces. In cases where the fiber holder I-FH" is made of a metal (e.g., aluminum, stainless steel), the coefficient of friction between an optical fiber (e.g., optical fiber OF47) and the internal surface of the fiber holder (e.g., the internal wall IW2" or base B1") may be no more than 0.7, for example in the range between 0.19 and 0.41 in case of the contact point being formed by a fused silica optical fiber and a stainless steel fiber holder. In comparison, the coefficient of friction between any two fused silica optical fibers may be in the range between 0.22-0.36.

To overcome surface friction, the resulting force vector of any optical fiber may fulfill the following conditions:

$$F_h \geq F_{fh}; \quad [1]$$

$$F_v \geq F_{fv}; \quad [2]$$

where, $$F_h = F_r \times \sin(\beta); \quad [3]$$

$$F_v = F_r \times \cos(\beta); \quad [4]$$

$$F_{fh} = F_v \times \text{cof}; \quad [5]$$

$$F_{fv} = F_h \times \text{cof}; \quad [6]$$

where $F_h$ denotes the tangential component of the resulting force $F_r$, $F_v$ denotes the vertical component of the resulting force $F_r$, $F_{fh}$ denotes the frictional force in the tangential direction (e.g., horizontal direction or x-direction), $F_{fv}$ denotes the frictional force in the normal direction (e.g., vertical direction or z-direction), cof denotes the coefficient of friction at the contact point, and $\beta$ denotes the angle formed between the resulting force vector and the vertical direction or z-direction.

Where an optical fiber is supported directly by the fiber holder I-FH" (internal wall and base), the design conditions expressed by equations [1] and [2] can be translated to the following angular condition:

$$\arctan(\text{cof}) \leq \beta \leq \text{arccot}(\text{cof}) \quad [7]$$

Applying a coefficient of friction into equation [7] will give rise to a preferred range of the resulting force vector angle $\beta$ of any optical fiber within which the frictional force can be overcome. For example, when the coefficient of friction is no more than 0.7, the resulting force vector angle $\beta$ is in the range: $35° \leq \beta \leq 55°$. In the fiber stacking arrangement I-FSA" shown in FIG. 17(c), the support angle may be equal to or substantially close to 90°, as defined by the angle between the two supporting surfaces e.g., the internal wall IW2" and the base B1".

Where an optical fiber is supported by another two optical fibers, the frictional force only lies in the tangential direction. The design condition expressed by equation [1] can be translated to the following angular condition:

$$\beta \geq \arctan(\text{cof}) \quad [8]$$

In case of fused silica optical fibers and when the coefficient of friction is 0.38, the preferred range of the resulting force vector angle β is calculated to be: β≥21°. Such a range can help ensure that the resulting force vector of any optical fiber that is supported by another two optical fibers is stronger than the frictional force at the fiber to fiber contact point or interface. However, while the fiber stacking arrangement cools down, the fiber holder may apply a (horizontal) shrinkage force to the fiber stack due to the mismatch in coefficient of thermal expansion between the optical fibers and the fiber holder. The shrinkage force may push those optical fibers that are supported by another two optical fibers up by acting against the frictional force at the fiber to fiber interface. To help ensure that the shrinkage force is stronger than the frictional force at any fiber to fiber interface, the resulting force vector of the optical fiber may further fulfill the following criterion:

$$\mathrm{Sin}(\beta)*\mathrm{Cos}(\beta) \geq \mathrm{cof} \qquad [9]$$

Applying the same coefficient of friction of 0.38 into equation [9] and assuming a negligible impact of the clamping force, the desired range of the resulting force vector angle β is thus calculated to be: 25°≤β≤65°. Such a tighter angular requirement (as compared to the above range β≥21°) may allow optical fibers to slide up and down at any fiber to fiber interface during temperature variations. In a preferred embodiment, the angle of the resulting force vector may be designed to be 45°±15°.

With reference to FIG. 17(c), to help ensure every optical fiber in the fiber stacking arrangement is well defined, i.e. neither over-defined nor under-defined, optical fibers OF43, OF45 which have two contact points with the fiber holder I-FH" (e.g., one with the internal wall and the other with the base) may be unsupported by another optical fiber. In some embodiments, there may exist a minimum distance G1, G2 between the outer surfaces of optical fiber OF45 and optical fiber OF47, and between the outer surfaces of optical fiber OF43 and optical fiber OF46. The minimum distance G1, G2 may be for example 1 μm or more. In addition, the width of the base on the second level B2" may be wider than ½ of the cross-section width (e.g., radius) of the optical fiber OF43, OF45 to help ensure a secure base support and facilitate better manufacturability. In some embodiments, the minimum difference G3 between the width of the second level base B2" and ½ of the cross-section width (e.g., radius) of the optical fiber OF43, OF45 may be for example 15 μm or more.

While mechanical clamping of a plurality of optical fibers is able to provide a robust and stable fiber stacking arrangement for applications, such as for example fiber switching in a HC-PCF based broadband radiation source, alternative approaches may also be used to achieve similar or the same effect. One alternative approach is to clamp a plurality of optical fibers using heat shrinkable fiber tubes. The idea behind such an alternative approach is that when being heated by a heat source (e.g., an arc heat source), the heat shrinkable fiber tubes starts to shrink and thus wraps the optical fibers together into a fiber bundle or a fiber stacking arrangement. Such an approach obviates the need of the stringent design criteria for the fiber stacking arrangement shown in FIG. 17(c) and allows the plurality of optical fibers to self-align into a robust and stable fiber stack. Furthermore, this approach allows a fiber stacking arrangement to be mounted in an easier manner.

Figure 18:
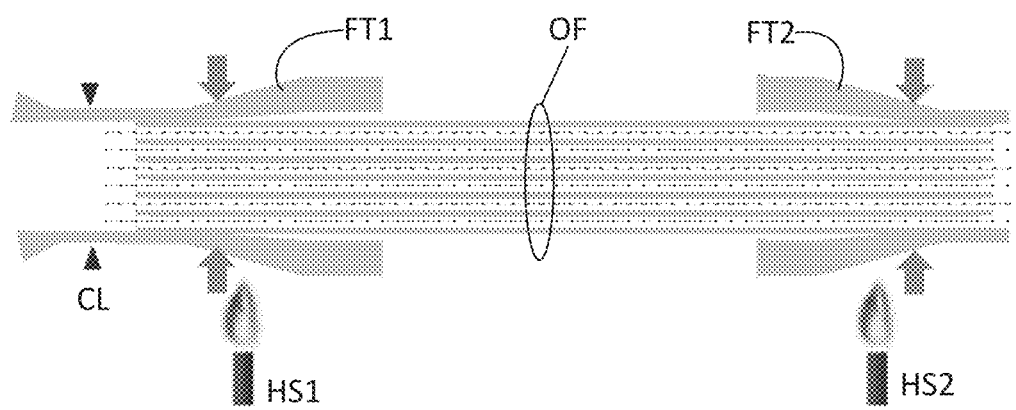
FIG. 18 is a schematic diagram depicting a process of making a fiber stacking arrangement by means of heat shrinkable tubing.

FIG. 18 is a schematic diagram depicting a process of making a fiber stacking arrangement by means of heat shrinkable tubing. In the example configuration shown in FIG. 18, two separate, substantially identical heat shrinkable fiber tubes or sleeves FT1, FT2 may be applied respectively at two end sections of a plurality of optical fibers OF. In such a case, each fiber tube FT1, FT2 may have a maximum length of between 10 mm and 50 mm and/or a minimum length between 2 mm and 5 mm; for example, this length may be in the range between 5 mm and 50 mm, or between 5 mm and 20 mm, or between 5 mm and 10 mm. In other example configurations, a single heat shrinkable fiber tube with a tube length substantially the same as or slightly longer than the full length of the optical fibers OF.

The manufacturing process for manufacturing a fiber stacking arrangement using heat shrinkable fiber tubing may comprise the following three steps:

Step 1: Placing each end of the plurality of optical fibers OF into one heat shrinkable fiber tube FT1, FT. Before placing into fiber tubes FT1, FT2, the optical fibers OF may be desirably pre-stacked to a desired stacking arrangement, e.g., in order to match the internal shape of the fiber tubes FT1, FT2.

Step 2: Heating two heat shrinkable fiber tubes FT1, FT2, sequentially or concurrently, with one or more heat sources HS1, HS2, so as to cause the two tubes to shrink and thus tightly wrap the plurality of optical fibers OF together. The degree of shrinking may depend on for example, the desired clamping force, the material of fiber tubes FT1, FT2, the internal shape of the fiber tubes, and/or how the optical fibers OF are stacked. Desirably, heat (as indicated by the large grey arrows in FIG. 18) is applied substantially homogeneous around a peripheral area of one or both fiber tubes depending on whether the two fiber tubes are heated sequentially or concurrently. Substantially homogeneous heating may be obtained for example by rotating the whole assembly (the optical fibers with the heat shrinkable tubes) about a central axis of the fiber tubes, or by simultaneously using multiple heat sources that are equally spaced around the periphery of fiber tubes FT1, FT2. To minimize the impact of heating on the optical fibers, fiber tubes FT1, FT2 may be made of a material having a melting temperature lower than that of optical fibers (e.g., lower than the melting temperature of fused silica). In some embodiments, the material of fiber tubes FT1, FT2 may be a certain type of soft glass, e.g., borosilicate.

Step 3: Cleaving the two fiber tubes, sequentially or concurrently, with one or more cleavers CL (e.g., fiber cleavers) such that the end surface of each fiber tube is substantially flush with end tips of the optical fibers OF. In many cases, the fiber tubes may be cleaved in such a manner that the end surface of each fiber tube is a small distance away from the fiber tips. This distance may be such that a fiber tube section between 0.1 mm and 5 mm, between 0.2 mm and 5 mm, between 0.5 mm and 5 mm, between 0.5 mm and 2 mm, or between 0.5 mm and 2 mm is not in contact with any of the optical fibers OF. As shown in FIG. 18, the cleaving position for fiber tube FT1 is indicated by the small black arrow.

FIGS. 19(a)-19(e) are the schematic cross-sectional views of five example fiber stacking arrangements all manufacturable by means of heat shrinkable fiber tubing (or heat-shrunk fiber tubing once assembled). For the sake of simplicity, only one fiber tube is shown and described for all the example fiber stacking arrangements. However, it should be appreciated that in practice, either a pair of substantially identical heat shrinkable fiber tubes each covering an end section of the optical fibers OF, or a single heat shrinkable fiber tube with a length substantially the same as or slightly longer than the full length of the optical fibers OF may be used.

Figure 19A:
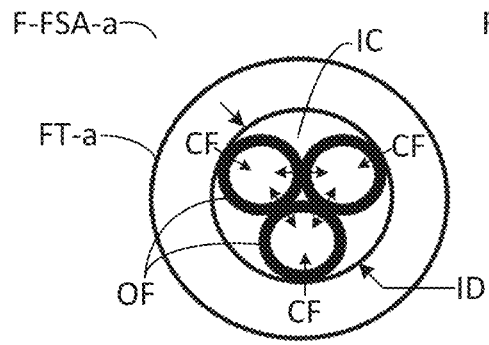
FIGS. 19(a)-19(e) are schematic cross-sectional views of example fiber stacking arrangements all manufactured by means of heat shrinkable fiber tubing.

In the first example shown in FIG. 19(a), the fiber stacking arrangement F-FSA-a may be manufactured using two separate but substantially identical heat shrinkable fiber tubes FT-a and FT-a' (used at the other end of the optical fibers and not shown in the Figure) which respectively clamp two end sections of the optical fibers OF. The heat shrinkable fiber tube FT-a may comprise an internal channel IC which may have a circular shape or a shape substantially close to the circular shape and a diameter ID (or other shape and cross-sectional width). It should be appreciated that after shrinkage, the shape of the internal channel IC may deviate slightly from its pre-shrinkage (or original) shape. For example, after shrinkage, the original circular shape of the internal channel IC of the fiber tube FT-a may finally settle into a shape that may no longer be circular but a shape lying between a polygonal and a circular shape. The fiber stacking arrangement may comprise three optical fibers OF, each having three contact points (one fiber-tube contact point and two fiber-fiber contact points). In contrast to the above embodiments where the clamping force(s) is applied to the optical fiber(s) located on the top of the fiber stack, the clamping force CF in this embodiment may be the thermal shrinkage force exerted by the heat shrinkable tube after being heated. Moreover, the clamping force in this embodiment may be applied to all the optical fibers OF, each being subject to substantially the same magnitude of the clamping force CF. In addition to the clamping force exerted by the fiber tube, each optical fiber may be subject to another two forces exerted by the other two optical fibers via the two fiber-fiber contact points. In such a manner, the force at each of the three contact points of an optical fiber can be supported by the other two contact points. The clamping of each optical fiber is thus well defined (in accordance with the above described design requirements).

Figure 19B:
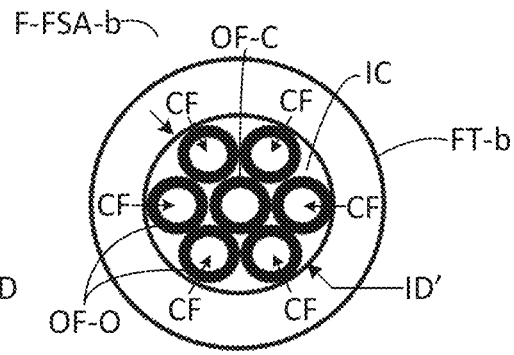

In the fiber stacking arrangement F-FSA-b shown in FIG. 19(b), the heat shrinkable fiber tube FT-b may be a variant of the fiber tube FT-a shown in FIG. 19(a) and the difference may predominantly lie in the larger cross-sectional width (e.g. diameter) ID' of the internal channel IC employed for clamping more optical fibers OF (e.g., more than three optical fibers OF). As shown in FIG. 19(b), one center fiber OF-C and six surrounding fibers OF-O are bundled or clamped together by the heat shrinkable fiber tube FT-b and form the fiber stacking arrangement F-FSA-b. Each of the surrounding optical fibers OF-O (those surrounding the center fiber) may be subject to substantially the same magnitude of the clamping force CF. In contrast to the example shown in FIG. 19(a), the clamping of the optical fibers in this fiber stacking arrangement F-FSA-b is not well defined, in that any surrounding optical fiber may be supported by three contact points, each associated with a different optical fiber. In this example arrangement, the center fiber OF-C may have a cross-sectional width (e.g. diameter) substantially the same as that of any of the six surrounding optical fibers. In a different example arrangement, the center fiber may have a cross-sectional width (e.g. diameter) different to that of the six surrounding optical fibers. In another example arrangement, a center structure (e.g., glass rod) may be used as a substitute for the center fiber OF-C.

Figure 19C:
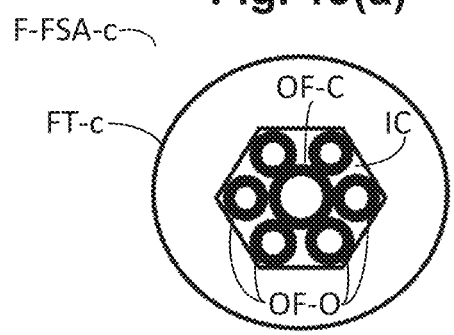
Figure 19D:
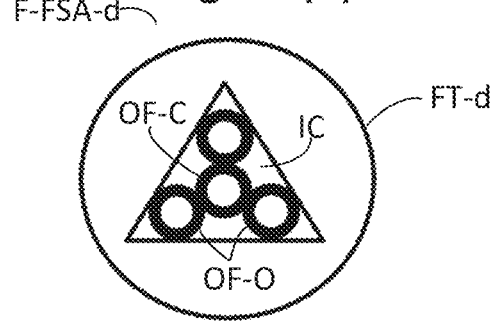

In order to robustly and stably clamp more optical fibers (e.g., more than three optical fibers) by means of heat shrinkable fiber tubing, it is desirable to use heat shrinkable fiber tubes that when shrunk, are capable of ensuring a well-defined clamping state for each optical fiber. This may require each optical fiber that is in direct contact with the heat shrinkable fiber tube to have only three contact points. The fiber stacking arrangements F-FSA-c, F-FSA-d shown in FIGS. 19(c) and 19(d) are examples that are capable of meeting such a requirement. The commonality between these two example fiber stacking arrangements may be such that a center optical fiber or a center structure is surrounded by three or more optical fibers (those in direct contact with a fiber tube) and each surrounding optical fiber has two contact points with the fiber tube and one contact point with the center fiber or center structure.

In the fiber stacking arrangement F-FSA-c shown in FIG. 19(c), seven optical fibers may be clamped by the heat shrinkable tube FT-c, the internal channel IC of which may have a hexagonal shape or a shape substantially close to a hexagonal shape. Each surrounding optical fiber OF-O may be placed at one of the six corners of the hexagonal internal channel IC and may thus have two contact points with the fiber tube FT-c, FT-c' (with two edges of the corner). Furthermore, each surrounding optical fiber OF-O may have a third contact point with the center fiber OF-C. As such, each surrounding optical fiber may have a total number of three contact points, resulting in a well-defined clamping state. In a similar manner, the internal channel IC of the heat shrinkable fiber tube FT-d in the fiber stacking arrangement F-FSA-d may have a triangular shape or a shape substantially close to a triangular shape. Each surrounding optical fiber OF-O may be placed at one of the three corners of the internal channel IC.

Note that, after shrinkage, the shape of the internal channel IC may deviate from its original pre-shrinkage shape (e.g., the hexagonal shape or triangular shape) and may settle into a shape lying between a polygonal (e.g., the hexagonal shape or triangular shape) and a circular shape. A well-defined clamping state can still be maintained after the shrinkage of the fiber tube insofar as each fiber only has three contact points. Note that, heat shrinkable fiber tubes with a different shaped or structured internal channel may be equally suitable for making a robust and stable fiber stacking arrangement. The internal channel of the heat shrinkable fiber tube may have other different polygonal shapes, for example, a quadrilateral shape, a pentagonal shape, heptagonal shape, octagonal shape, or a nonagonal shape. Alternatively, the shape of the internal channel may be any shape e.g., regular or irregular polygons or irregular shapes comprising both circular regions and corners, so long as the internal channel comprises multiple corners each providing support to an optical fiber via two contact points and a center fiber or center structure providing a further support to the optical fiber via a third contact point. In some different example arrangements, the center fiber or center structure may have a cross-sectional width (e.g. diameter) different to the surrounding optical fibers.

Figure 19E:
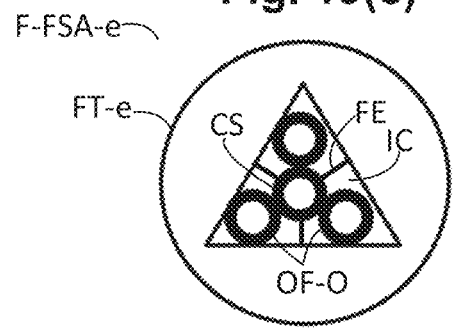

In the fiber stacking arrangement F-FSA-e shown in FIG. 19(e), the internal channel IC of the heat shrinkable fiber tube FT-e may comprise a center structure (e.g., a glass rod) and three internal fixing elements FE arranged to fixedly connect the center structure CS to the three triangle edges of the internal channel IC. The internal fixing elements FE may be for example three thin walls each extending along the radial and axial directions. The internal fixing elements FE may separate the internal channel into three sub-volumes each containing one surrounding optical fiber OF-O. In cases of the internal channel IC having a different polygonal shape, the number of the internal fixing elements FE may be the same as the number of the edges of the polygon and each internal fixing element may be arranged to connect the center structure to one of the polygon edges. As such, each sub-volume formed between any two adjacent fixing elements and the center structure may contain only one optical fiber.

A broadband radiation source configured to extend overall lifetime of the radiation source as disclosed herein, comprises a fiber assembly which may, for example, comprise any of the configurations shown in FIG. 10(a), 10(b), 11(a), 11(b), 15, 17(a), 17(b), 17(c), 18 or 19.

A broadband radiation source configured to extend overall lifetime of the radiation source as disclosed herein, comprises a fiber assembly and may comprise any of the configurations shown in FIG. 12, 13, or 14.

Figure 20:
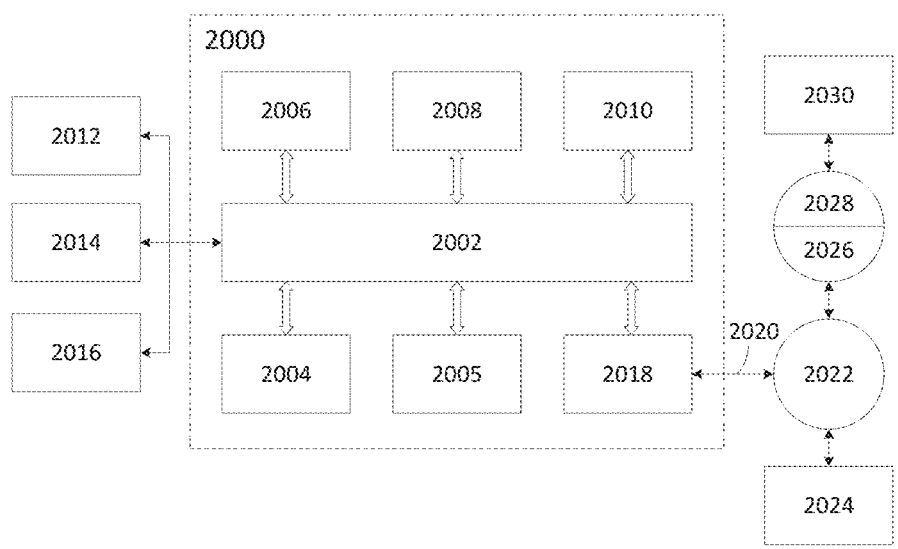
FIG. 20 depicts a block diagram of a computer system for controlling a broadband radiation source.

FIG. 20 is a block diagram that illustrates a computer system 2000 that may assist in implementing one or more of the methods and flows disclosed herein. Computer system 2000 includes a bus 2002 or other communication mechanism for communicating information, and a processor 2004 (or multiple processors 2004 and 2005) coupled with bus 2002 for processing information. Computer system 2000 also includes a main memory 2006, such as a random access memory (RAM) or other dynamic storage device, coupled to bus 2002 for storing information and instructions to be executed by processor 2004. Main memory 2006 also may be used for storing temporary variables or other intermediate information during execution of instructions to be executed by processor 2004. Computer system 2000 further includes a read only memory (ROM) 2008 or other static storage device coupled to bus 2002 for storing static information and instructions for processor 2004. A storage device 2010, such as a magnetic disk or optical disk, is provided and coupled to bus 2002 for storing information and instructions.

Computer system 2000 may be coupled via bus 2002 to a display 2012, such as a cathode ray tube (CRT) or flat panel or touch panel display for displaying information to a computer user. An input device 2014, including alphanumeric and other keys, is coupled to bus 2002 for communicating information and command selections to processor 2004. Another type of user input device is cursor control 2016, such as a mouse, a trackball, or cursor direction keys for communicating direction information and command selections to processor 2004 and for controlling cursor movement on display 2012. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 2000 in response to processor 2004 executing one or more sequences of one or more instructions contained in main memory 2006. Such instructions may be read into main memory 2006 from another computer-readable medium, such as storage device 2010. Execution of the sequences of instructions contained in main memory 2006 causes processor 2004 to perform the process steps described herein. One or more processors in a multi-processing arrangement may also be employed to execute the sequences of instructions contained in main memory 2006. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 2004 for execution. Such a medium may take many forms, including but not limited to, non-volatile media, volatile media, and transmission media. Non-volatile media include, for example, optical or magnetic disks, such as storage device 2010. Volatile media include dynamic memory, such as main memory 2006. Transmission media include coaxial cables, copper wire and fiber optics, including the wires that comprise bus 2002. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2004 for execution. For example, the instructions may initially be borne on a magnetic disk of a remote computer. The remote computer can load the instructions into its dynamic memory and send the instructions over a telephone line using a modem. A modem local to computer system 2000 can receive the data on the telephone line and use an infrared transmitter to convert the data to an infrared signal. An infrared detector coupled to bus 2002 can receive the data carried in the infrared signal and place the data on bus 2002. Bus 2002 carries the data to main memory 2006, from which processor 2004 retrieves and executes the instructions. The instructions received by main memory 2006 may optionally be stored on storage device 2010 either before or after execution by processor 2004.

Computer system 2000 also preferably includes a communication interface 2018 coupled to bus 2002. Communication interface 2018 provides a two-way data communication coupling to a network link 2020 that is connected to a local network 2022. For example, communication interface 2018 may be an integrated services digital network (ISDN) card or a modem to provide a data communication connection to a corresponding type of telephone line. As another example, communication interface 2018 may be a local area network (LAN) card to provide a data communication connection to a compatible LAN. Wireless links may also be implemented. In any such implementation, communication interface 2018 sends and receives electrical, electromagnetic or optical signals that carry digital data streams representing various types of information.

Network link 2020 typically provides data communication through one or more networks to other data devices. For example, network link 2020 may provide a connection through local network 2022 to a host computer 2024 or to data equipment operated by an Internet Service Provider (ISP) 2026. ISP 2026 in turn provides data communication services through the worldwide packet data communication network, now commonly referred to as the "Internet" 2028. Local network 2022 and Internet 2028 both use electrical, electromagnetic or optical signals that carry digital data streams. The signals through the various networks and the signals on network link 2020 and through communication interface 2018, which carry the digital data to and from computer system 2000, are exemplary forms of carrier waves transporting the information.

Computer system 2000 may send messages and receive data, including program code, through the network(s), network link 2020, and communication interface 2018. In the Internet example, a server 2030 might transmit a requested code for an application program through Internet 2028, ISP 2026, local network 2022 and communication interface 2018. One such downloaded application may provide for one or more of the techniques described herein, for example. The received code may be executed by processor 2004 as it is received, and/or stored in storage device 2010, or other non-volatile storage for later execution. In this manner, computer system 2000 may obtain application code in the form of a carrier wave.

Further embodiments are disclosed in the follow list of numbered clauses:

1. A broadband radiation source device, comprising:
    a fiber assembly comprising a plurality of optical fibers, each optical fiber being filled with a gas medium;
    wherein the broadband radiation source device is operable such that subsets of the optical fibers are independently selectable for receiving a beam of input radiation so as to generate a broadband output from only a subset of the plurality of optical fibers at any one time.
2. A broadband radiation source device as defined in clause 1, wherein the broadband radiation source device is operable such that any one of the plurality of optical fibers is singly selectable for receiving a beam of input radiation.
3. A broadband radiation source device as defined in clause 1 or 2, wherein each of the optical fibers comprises a hollow core photonic crystal fiber.
4. A broadband radiation source device as defined in clause 1, 2 or 3, comprising: a beam splitting arrangement operable to spatially split the beam of input radiation into multiple input beams,
a focusing arrangement to focus each of the multiple input beams into a respective optical fiber of the subset of optical fibers.
5. A broadband radiation source device as defined in clause 1, 2 or 3 being operable such that the broadband output is generated from only one of the plurality of optical fibers at any one time.
6. A broadband radiation source device as defined in any preceding clause, wherein the plurality of optical fibers comprise two or more fibers with substantially the same fiber properties.
7. A broadband radiation source device as defined in any preceding clause, wherein the plurality of optical fibers comprise two or more fibers with different fiber properties.
8. A broadband radiation source device as defined in clause 7, wherein some or each of the two or more fibers with different fiber properties is configured to generate the broadband output in a different spectral range.
9. A broadband radiation source device as defined in clause 8, wherein the different spectral range each comprise a different sub-range in a range between 200 nm to 2500 nm.
10. A broadband radiation source device as defined in any preceding clause, wherein the plurality of optical fibers are stacked together and mechanical clamped, fused or welded together.
11. A broadband radiation source device as defined in any preceding clause, wherein the fiber assembly further comprises a gas cell enclosing the plurality of optical fibers and gas medium.
12. A broadband radiation source device as defined in any preceding clause, wherein the fiber assembly is configured to be movable with respect to the beam of input radiation so as to allow a different one of the plurality of optical fibers to be selected.
13. A broadband radiation source device as defined in any preceding clause, wherein the beam of input radiation is configured to be movable with respect to the fiber assembly so as to allow a different one of the plurality of optical fibers to be selected.
14. A broadband radiation source device as defined in any of clauses 12 or 13, wherein the fiber assembly or the beam of input radiation is movable in one or both directions of a plane perpendicular to a propagation direction of the beam of input radiation.
15. A broadband radiation source device as defined in any preceding clause, configured to switch to a different optical fiber of the plurality of optical fibers to generate the broadband output when a power of the broadband output drops below a threshold level.
16. A broadband radiation source device as defined in any preceding clause, configured to switch to a different optical fiber of the plurality of optical fibers to generate the broadband output when a different optical property of the broadband output is desired; wherein the different optical property comprises a different spectral range.
17. A broadband radiation source device as defined in any preceding clause, further comprising a first beam shifting assembly configured to spatially shift the input radiation with respect to the fiber assembly.
18. A broadband radiation source device as defined in clause 17, wherein the first beam shifting assembly comprises one or more of:
    at least one glass plate comprising one or both of a first plate and a second plate, the first plate being rotatable about a first axis and the second plate being rotatable about a second axis, wherein the first axis and the second axis are perpendicular to each other and form a plane parallel to an input facet of the fiber assembly, and optionally wherein the at least one glass plate is comprised of a low dispersion material, for example N-FK58 of CaF2;
    at least one piezo-mirror; and
    at least one galvo-scanner.
19. A broadband radiation source device as defined in any of clauses 17 or 18, further comprising a second beam shifting assembly configured to spatially shift the broadband output such that the broadband output follows substantially a predetermined beam path.
20. A broadband radiation source device as defined in clause 19, wherein the beam path is determined according to one or both of: optical alignment in a metrology tool configured to use the broadband output, a position of an output delivery fiber configured to deliver the broadband output.
21. A broadband radiation source device as defined in any preceding clause, further comprising a beam block configured to at least partially block the input radiation when switching optical fibers.
22. A broadband radiation source device as defined in any preceding clause, further comprising an input optical lens arrangement configured to couple the input radiation into one of the plurality of optical fibers of the fiber assembly.
23. A broadband radiation source device as defined in clause 22, operable such that position and/or orientation of the input optical lens arrangement is adjustable for optimizing the fiber coupling of the input radiation.
24. A broadband radiation source device as defined in any preceding clause, further comprising an output optical lens arrangement configured to collimate the broadband output.
25. A broadband radiation source device as defined in clause 24, operable such that position and/or orientation of the output optical lens arrangement is adjustable for optimizing position and/or orientation of the broadband output.
26. A broadband radiation source device as defined in any preceding clause, wherein the fiber assembly comprises a multi-core microstructured fiber wherein the optical fibers each comprise a microstructured fiber core.

27. A broadband radiation source device as defined in any preceding clause, wherein the fiber assembly comprises a support portion to support the plurality of optical fibers.

28. A broadband radiation source device as defined in any preceding clause, wherein the plurality of optical fibers is arranged in a 1 dimensional or 2 dimensional linear array.

29. A broadband radiation source device as defined in any of clauses 1 to 27, wherein the plurality of optical fibers is arranged in a ring arrangement comprising a single ring or plurality of concentric rings.

30. A broadband radiation source device as defined in any preceding clause, further comprising a pump radiation source configured to provide the beam of input radiation.

31. A broadband radiation source device as defined in any of clauses 1 to 25, wherein the fiber assembly comprises:
a fiber holder configured to hold the plurality of optical fibers that are stacked together; and
at least one fiber clamp configured to apply at least one clamping force to the plurality of optical fibers such that the plurality of optical fibers are stably clamped;
wherein each of the plurality of optical fibers is supported by two contact points and is subject to a force vector that intersects a line formed in-between the two contact points supporting the fiber.

32. A broadband radiation source device as defined in clause 31, wherein the force vector to which each optical fiber is subject either directly results from the at least one clamping force or results from one or more force vectors transferred through one or more contacting optical fibers.

33. A broadband radiation source device as defined in any of clauses 31 or 32, wherein the fiber holder comprises a multi-level structure, and a distance between two facing internal walls on a lower level being smaller than that on an upper level and the two facing internal walls of each level being substantially perpendicular to a base of the same level.

34. A broadband radiation source device as defined in clause 33, wherein the multi-level structure of the fiber holder results in a multi-level fiber stack, further wherein a center distance between any two adjacent optical fibers on the same stacking level reduces per fiber level from a bottom fiber level to a top fiber level.

35. A broadband radiation source device as defined in clause 34, wherein the bottom level of the fiber holder holds two optical fibers and the center distance between the two optical fibers is larger than a diameter of the plurality of optical fibers by a factor of between 1.5 and 1.9, between 1.6 and 1.8, between 1.65 and 1.75, or between 1.69 and 1.71.

36. A broadband radiation source device as defined in clause 35, wherein the multi-level structure comprises a first level and a second level, the first level being lower than the second level, further wherein the distance between the two facing internal walls of the first level is larger than the fiber diameter by a factor of between 2.5 and 2.9, between 2.6 and 2.8, between 2.65 and 2.75 or between 2.69 and 2.71, and the distance between the two facing internal walls of the second level is larger than the fiber diameter by a factor of between 3.5 and 3.9, between 3.6 and 3.8, between 3.65 and 3.75 or between 3.69 and 3.71.

37. A broadband radiation source device as defined in any of clauses 31 to 36, wherein the diameter of the plurality of optical fibers is in the range between 10 μm and 1000 μm.

38. A broadband radiation source device as defined in any of clauses 31 to 37, wherein the at least one clamping force is sufficiently strong such that each of the plurality of optical fibers can be firmly fixed in position, and does not exceed a maximum force allowable by any of the plurality of optical fibers.

39. A broadband radiation source device as defined in clause 38, wherein the maximum force is the force which changes at least one of the properties of any of the plurality of optical fibers.

40. A broadband radiation source device as defined in any of clauses 31 to 39, wherein a support angle defined between the two contact points of each optical fiber lies within a range between 60° and 120°.

41. A broadband radiation source device as defined in clause 33, wherein the multi-level structure of the fiber holder results in a multi-level fiber stack, further wherein the at least one clamping force comprises two clamping forces applied respectively to two optical fibers located on the top of the multi-level fiber stack.

42. A broadband radiation source device as defined in clause 41, wherein each of the plurality of optical fibers is arranged to fulfill the following conditions:
for each optical fiber supported by an internal wall and a base of the fiber holder, the angle formed between the force vector subject by the optical fiber and a direction substantially perpendicular to the base of the fiber holder lies in a range between 35° and 55°; and
for each optical fiber supported by another two optical fibers, the angle formed between the force vector subject by the optical fiber and a direction substantially perpendicular to the base of the fiber holder lies in a range between 25° and 65°.

43. A broadband radiation source device as defined in clause 42, wherein each of the plurality of optical fibers is arranged to fulfill the further condition that any two adjacent optical fibers that are each supported by both an internal wall and a base of the fiber holder are physically separated.

44. A broadband radiation source device as defined in clause 43, wherein the any two optical fibers are separated by a distance of 1 μm or more.

45. A broadband radiation source device as defined in any of clauses 42 to 44, wherein each of the plurality of optical fibers is arranged to fulfill the further condition that any upper level base has a width that is larger than a radius of the plurality of optical fibers.

46. A broadband radiation source device as defined in clause 45, wherein a difference between the width of any upper level base and the radius of the plurality of optical fibers is 15 μm or more.

47. A broadband radiation source device as defined in any of clauses 41 to 46, wherein the two clamping forces have substantially the same magnitude.

48. A broadband radiation source device as defined in any of clauses 1 to 25, wherein the fiber assembly comprises at least one heat-shrunk fiber tube which surrounds at least a first end section and a second end section of the plurality of optical fibers; the at least one heat-shrunk fiber tube being configured to apply a clamping force to the at least a first end section and a second end section of the plurality of optical fibers.

49. A broadband radiation source device as defined in clause 48, wherein the at least one heat-shrunk fiber tube comprises two separate heat-shrunk fiber tubes, each being configured to clamp a respective one of the first end section and the second end section of the plurality of optical fibers.

50. A broadband radiation source device as defined in clause 48, wherein the at least one heat-shrunk fiber tube comprises a single heat-shrunk fiber tube configured to cover the full length of the plurality of optical fibers.

51. A broadband radiation source device as defined in any of clauses 48 to 50, wherein the at least one heat-shrunk fiber tube comprises a material having a lower melting point than that of the plurality of optical fibers.

52. A broadband radiation source device as defined in clause 51, wherein the material is borosilicate.

53. A broadband radiation source device as defined in any of clauses 48 to 52, wherein each of the at least one heat-shrunk fiber tube comprises an internal channel which is in direct contact with at least some of the plurality of optical fibers.

54. A broadband radiation source device as defined in clause 53, wherein the internal channel of each of the at least one heat-shrunk fiber tube comprises a circular cross section.

55. A broadband radiation source device as defined in clause 53, wherein the internal channel of each of the at least one heat-shrunk fiber tube comprises, in cross section, a plurality of corners, each supporting one of the plurality of optical fibers via two contact points.

56. A broadband radiation source device as defined in clause 55, wherein the internal channel of each of the at least one heat-shrunk fiber tube comprises a polygonal cross section.

57. A broadband radiation source device as defined in clause 55, wherein the internal channel of each of the at least one heat-shrunk fiber tube has a regular or irregular polygonal shape or an irregular shape comprising both a circular region and corners.

58. A broadband radiation source device as defined in any of clauses 53 to 57, wherein each of the at least one heat-shrunk fiber tube further comprises a center structure against which the plurality of optical fibers are clamped.

59. A broadband radiation source device as defined in clause 58, wherein the center structure is fixedly connected to the internal channel of the at least one heat-shrunk fiber tube by means of a plurality of internal fixing elements, each connecting the center structure to an edge of the internal channel.

60. A metrology device comprising a broadband radiation source device as defined in any preceding clause.

61. A metrology device as defined in clause 60, comprising a scatterometer metrology apparatus, a level sensor or an alignment sensor.

62. A method for generating broadband radiation, comprising:
emitting input radiation from a pump source;
receiving the input radiation by a selected subset of a plurality of optical fibers; and
generating from the selected subset of the plurality of optical fibers a broadband output.

63. A method as defined in clause 62, wherein each of the optical fibers comprises a hollow core photonic crystal fiber.

64. A method as defined in any of clauses 62 or 63, wherein the subset comprises a single optical fiber of the plurality of optical fibers.

65. A method as defined in clause 64, comprising switching to another optical fiber of the plurality of optical fibers for the receiving and generating steps.

66. A method as defined in clause 65, wherein the switching step comprises switching to a similar optical fiber when the optical fiber being used for the generating is deemed to require replacement.

67. A method as defined in any of clauses 65 or 66, wherein the optical fiber being used for the generating is deemed to require replacement when a power of the broadband output drops below a threshold level.

68. A method as defined in any of clauses 65 to 67, wherein the switching step comprises switching to a an optical fiber with at least one different fiber property, so as to generate the broadband output to have at least one different radiation characteristic;

69. A method as defined in clause 67, wherein the at least one different radiation characteristic comprises a different spectral range.

70. A method as defined in any of clauses 62 to 69, wherein the switching step comprises one or both of:
moving the fiber assembly with respect to the input radiation; and
moving the input radiation with respect to the fiber assembly.

71. A method for mechanical clamping a plurality of optical fibers, comprising:
holding the plurality of optical fibers to form a fiber stack; and
applying at least one clamping force to the plurality of optical fibers such that the plurality of optical fibers are stably clamped;
wherein each of the plurality of optical fibers is supported by two contact points and is subject to a force vector that intersects a line formed in-between the two contact points supporting the fiber.

72. A method as defined in clause 71, wherein a center distance between any two adjacent optical fibers on the same stacking level of the fiber stack reduces per fiber level from a bottom fiber level to a top fiber level.

73. A method as defined in any of clauses 60 or 61, further comprising arranging each of the plurality of optical fibers to fulfill the following conditions:
for each optical fiber supported by an internal wall and a base of the fiber holder, the angle formed between the force vector subject by the optical fiber and a direction substantially perpendicular to the base of the fiber holder lies in a range between 35° and 55°; and
for each optical fiber supported by another two optical fibers, the angle formed between the force vector subject by the optical fiber and a direction substantially perpendicular to the base of the fiber holder lies in a range 25° and 65°.

74. A method for clamping a plurality of optical fibers by means of at least one heat shrinkable fiber tube, comprising:
placing both end sections of the plurality of optical fibers into the at least one heat shrinkable fiber tube;
heating the at least one shrinkable fiber tube so as to cause the at least one shrinkable fiber tube to shrink; and
cleaving the at least one shrinkable fiber tube such that each end surface of the at least one shrinkable fiber tube is substantially flush with end surfaces of the plurality of optical fibers.

Although specific reference may be made in this text to the use of lithographic apparatus in the manufacture of integrated circuits, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fiber assembly for a broadband radiation source, the fiber assembly comprising:
   a fiber holder holding a plurality of optical fibers that are stacked together; and
   at least one fiber clamp configured to apply at least one clamping force to the plurality of optical fibers such that the plurality of optical fibers are stably clamped,
   wherein each of the plurality of optical fibers is supported by two contact points and is subject to a force vector that intersects a line formed in-between the two contact points supporting the respective fiber, the force vector being a vector of the combination of all applied force acting on the respective fiber.

2. The fiber assembly of claim 1, wherein the force vector to which each optical fiber is subject either directly results from the at least one clamping force or results from one or more force vectors transferred through one or more contacting optical fibers.

3. The fiber assembly of claim 1, wherein the fiber holder comprises a multi-level structure, and a distance between two facing internal walls on a lower level being smaller than that on an upper level and the two facing internal walls of each level being substantially perpendicular to a base of the same level.

4. The fiber assembly of claim 3, wherein the multi-level structure of the fiber holder results in a multi-level fiber stack, further wherein a center distance between any two adjacent optical fibers on the same stacking level reduces per fiber level from a bottom fiber level to a top fiber level.

5. The fiber assembly of claim 4, wherein the bottom level of the fiber holder holds two optical fibers and the center distance between the two optical fibers is larger than a diameter of the plurality of optical fibers by a factor of between 1.5 and 1.9.

6. The fiber assembly of claim 3, wherein the multi-level structure of the fiber holder results in a multi-level fiber stack, further wherein the at least one clamping force comprises two clamping forces applied respectively to two optical fibers located on the top of the multi-level fiber stack.

7. The fiber assembly of claim 1, wherein a diameter of the plurality of optical fibers is in the range between 10 μm and 1000 μm.

8. The fiber assembly of claim 1, wherein a support angle defined between the two contact points of each optical fiber lies within a range between 60° and 120°.

9. The fiber assembly of claim 1, wherein each of the plurality of optical fibers is arranged to fulfill the following conditions:
   for each optical fiber supported by an internal wall and a base of the fiber holder, the angle formed between the force vector subject by the optical fiber and a direction substantially perpendicular to the base of the fiber holder lies in a range between 35° and 55°; and
   for each optical fiber supported by another two optical fibers, the angle formed between the force vector subject by the optical fiber and a direction substantially perpendicular to the base of the fiber holder lies in a range between 25° and 65°.

10. The fiber assembly of claim 9, wherein each of the plurality of optical fibers is arranged to fulfill the further condition that any two adjacent optical fibers that are each supported by both an internal wall and a base of the fiber holder are physically separated.

11. The fiber assembly of claim 9, wherein each of the plurality of optical fibers is arranged to fulfill the further condition that any upper level base has a width that is larger than a radius of the plurality of optical fibers.

12. A method of manufacturing the fiber assembly of claim 1, the method comprising:
   holding the plurality of optical fibers to form a fiber stack; and
   applying the at least one clamping force to the plurality of optical fibers such that the plurality of optical fibers are stably clamped,
   wherein each of the plurality of optical fibers is supported by two contact points and is subject to the force vector that intersects a line formed in-between the two contact points supporting the fiber.

13. A fiber assembly for a broadband radiation source, the fiber assembly comprising:
   a plurality of optical fibers bundled together, wherein each fiber has a first end section, a second end section and a side spanning between the first and second end sections; and
   at least one shrunk heat-shrinkable fiber tube which surrounds at least the first and second end sections of the plurality of optical fibers,
   wherein the side of at least one of the optical fibers contacts the side of another one of the optical fibers underneath the at least one shrunk heat-shrinkable fiber tube,
   wherein the at least one shrunk heat-shrinkable fiber tube is configured to apply a clamping force to the bundle of optical fibers at least at the first and second end sections of the plurality of optical fibers, and
   wherein the at least one heat-shrinkable fiber tube is configured to shrink at least by mere application of heat.

14. The fiber assembly of claim 13, wherein the at least one shrunk heat-shrinkable fiber tube comprises two separate shrunk heat-shrinkable fiber tubes, each being configured to clamp a respective one of the first end section and the second end section of the plurality of optical fibers.

15. The fiber assembly of claim 13, wherein the at least one shrunk heat-shrinkable fiber tube comprises a single shrunk heat-shrinkable fiber tube configured to cover the full length of the plurality of optical fibers.

16. The fiber assembly of claim 13, wherein the at least one shrunk heat-shrinkable fiber tube comprises a material having a lower melting point than that of the plurality of optical fibers.

17. The fiber assembly of claim 13, wherein each of the at least one shrunk heat-shrinkable fiber tube comprises an internal channel which is in direct contact with at least some of the plurality of optical fibers.

18. The fiber assembly of claim 17, wherein the internal channel of each of the at least one shrunk heat-shrinkable fiber tube comprises, in cross section, a plurality of corners, each supporting one of the plurality of optical fibers via two contact points.

19. The fiber assembly of claim 17, wherein each of the at least one shrunk heat-shrinkable fiber tube further comprises a center structure against which the plurality of optical fibers are clamped.

20. A method of manufacturing the fiber assembly of claim 13, the method comprising:
  placing both end sections of the plurality of optical fibers into the at least one heat shrinkable fiber tube;
  heating the at least one shrinkable fiber tube so as to cause the at least one shrinkable fiber tube to shrink; and
  cleaving the at least one shrinkable fiber tube such that each end surface of the at least one shrinkable fiber tube is substantially flush with end surfaces of the plurality of optical fibers.

* * * * *